(12) United States Patent
James et al.

(10) Patent No.: US 9,379,323 B2
(45) Date of Patent: Jun. 28, 2016

(54) COMPOSITION HAVING IMPROVED PERFORMANCE

(75) Inventors: Mark James, Romsey (GB); Magda Goncalves-Miskiewicz, Southhampton (GB); Philip Edward May, Sidcup (GB); Ruth Effenberger, Undenheim (DE); Edgar Kluge, Gross-Gerau (DE); Heinrich Becker, Ober-Ramstadt (DE)

(73) Assignee: Merck Patent GmbH, Darmstadt (DE)

( * ) Notice: Subject to any disclaimer, the term of this patent is extended or adjusted under 35 U.S.C. 154(b) by 311 days.

(21) Appl. No.: 13/640,400

(22) PCT Filed: Apr. 5, 2011

(86) PCT No.: PCT/EP2011/001681
§ 371 (c)(1),
(2), (4) Date: Oct. 10, 2012

(87) PCT Pub. No.: WO2011/128034
PCT Pub. Date: Oct. 20, 2011

(65) Prior Publication Data
US 2013/0026415 A1 Jan. 31, 2013

(30) Foreign Application Priority Data
Apr. 12, 2010 (EP) .................................... 10003858

(51) Int. Cl.
*C09K 11/06* (2006.01)
*H01L 51/00* (2006.01)
*H01L 51/50* (2006.01)

(52) U.S. Cl.
CPC ........ *H01L 51/0005* (2013.01); *H01L 51/0007* (2013.01); *H01L 51/0074* (2013.01); *H01L 51/0094* (2013.01); *H01L 51/5012* (2013.01); *H01L 51/5016* (2013.01); *H01L 51/5048* (2013.01)

(58) Field of Classification Search
CPC .... C09K 11/06; H01L 51/56; H01L 51/0085; H01L 51/0087
USPC .......................... 252/301.16, 301.18; 438/46; 257/E51.026
See application file for complete search history.

(56) References Cited

U.S. PATENT DOCUMENTS

| | | | |
|---|---|---|---|
| 6,825,061 B2 | 11/2004 | Hokari et al. | |
| 7,345,301 B2 | 3/2008 | Gerhard et al. | |
| 7,659,010 B2 | 2/2010 | Burn et al. | |
| 8,974,702 B2 * | 3/2015 | May et al. ................. | C09D 5/24 252/500 |
| 2003/0068528 A1 * | 4/2003 | Thompson et al. . | H01L 51/0077 428/690 |
| 2004/0077862 A1 * | 4/2004 | Stossel et al. ........ | C07F 15/0033 546/2 |
| 2004/0099882 A1 | 5/2004 | Hokari et al. | |
| 2004/0133004 A1 * | 7/2004 | Stossel et al. ......... | C07F 15/004 546/2 |
| 2004/0135131 A1 * | 7/2004 | Treacher et al. ..... | C07C 17/2632 252/582 |
| 2004/0138455 A1 * | 7/2004 | Stossel et al. ........ | C07F 15/0033 546/2 |
| 2005/0131232 A1 * | 6/2005 | Stossel et al. ........ | C07F 15/0033 546/2 |
| 2005/0176958 A1 * | 8/2005 | Stossel et al. ........ | C07F 15/0033 546/4 |
| 2006/0208221 A1 | 9/2006 | Gerhard et al. | |
| 2007/0080342 A1 * | 4/2007 | Bold et al. .......... | C07F 15/0033 257/40 |
| 2007/0153371 A1 | 7/2007 | Cha et al. | |
| 2008/0161567 A1 * | 7/2008 | Stoessel et al. ..... | C07F 15/0033 546/10 |
| 2008/0200677 A1 * | 8/2008 | Stoessel et al. ..... | C07F 15/0033 546/4 |
| 2008/0206447 A1 | 8/2008 | Inoue et al. | |
| 2010/0019232 A1 * | 1/2010 | Lee et al. ............ | H01L 51/5092 257/40 |
| 2010/0224859 A1 * | 9/2010 | Gough et al. .......... | B82Y 20/00 257/13 |
| 2010/0243960 A1 | 9/2010 | Matsue et al. | |
| 2012/0104380 A1 * | 5/2012 | James et al. .............. | C09D 5/24 257/40 |
| 2012/0211701 A1 * | 8/2012 | Spreitzer et al. ........ | C07B 59/00 252/301.16 |
| 2012/0256137 A1 * | 10/2012 | James et al. ........ | H01L 51/0003 252/500 |
| 2012/0273736 A1 * | 11/2012 | James et al. ............. | C09D 5/24 252/519.21 |
| 2013/0015403 A1 * | 1/2013 | Becker et al. ....... | H01L 51/0059 252/301.16 |
| 2013/0026415 A1 * | 1/2013 | James et al. ........ | H01L 51/0005 252/301.16 |
| 2013/0026421 A1 * | 1/2013 | James et al. ........ | H01L 51/0007 252/500 |
| 2013/0069020 A1 * | 3/2013 | May et al. .............. | C09K 11/06 252/519.21 |

FOREIGN PATENT DOCUMENTS

| | | |
|---|---|---|
| EP | 2216380 A1 | 8/2010 |
| EP | 1950816 A4 | 2/2012 |
| JP | 2007504272 A | 3/2007 |
| WO | WO-2004/093207 A2 | 10/2004 |
| WO | WO-2008107089 A1 | 9/2008 |
| WO | WO-2009064026 A1 | 5/2009 |
| WO | WO-2009109273 A1 | 9/2009 |

OTHER PUBLICATIONS

CRC Handbook of Chemistry and Physics, CRC Press, Inc., 77th ed., 1996, pp. 6-208 to 212.*
International Search Report for PCT/EP2011/001681 mailed Jul. 14, 2011.
U.S. Appl. No. 13/640,408.
International Search Report for PCT/EP2011/001682 mailed Jun. 30, 2011.

* cited by examiner

*Primary Examiner* — Douglas MC Ginty
(74) *Attorney, Agent, or Firm* — Drinker Biddle & Reath LLP

(57) ABSTRACT

The present invention relates to novel compositions comprising light emitting materials and/or charge transporting materials and one or more organic solvents having a viscosity at 25° C. of at least 10 mPas and a boiling point of at most 400° C., to their use as inks for the preparation of organic light emitting diode (OLED) devices, to methods for preparing OLED devices using the novel formulations, and to OLED devices prepared from such methods and formulations.

21 Claims, 3 Drawing Sheets

US 9,379,323 B2

COMPOSITION HAVING IMPROVED PERFORMANCE

CROSS-REFERENCE TO RELATED APPLICATIONS

This application is a national stage application (under 35 U.S.C. §371) of PCT/EP2011/001681, filed Apr. 5, 2011, which claims benefit of European application 10003858.7, filed Apr. 12, 2010.

FIELD OF THE INVENTION

The present invention relates to novel compositions comprising light emitting materials and/or charge transporting materials, to their use as inks for the preparation of organic light emitting diode (OLED) devices, to methods for preparing OLED devices using the novel compositions, and to OLED devices prepared from such methods and compositions.

BACKGROUND AND PRIOR ART

When preparing OLED devices usually printing techniques like inkjet printing, roll to roll printing, slot dye coating or gravure printing are used to apply the active layer. Based on low solubility of the most of the present organic compounds useful as emitting materials and/or charge transporting materials, these techniques need the use of solvents in high amounts.

Printing formulations usually comprise aromatic or aliphatic organic solvents and tend to have low viscosities. While this approach serves well for spin coating and ink jet printing (IJP) fabrication methods, recently there has been a growing interest in using traditional printing technologies, like flexographic or gravure printing, to fabricate devices. This requires different types of formulations, in particular with respect to the choice of the solvents and optional additives like viscosity enhancers.

In order to improve the film forming ability and the rheology binding agents can be used. These additives are especially needed with regard to light emitting materials and/or charge transporting materials having small molecular weight or polymeric compounds having a low molecular weight.

U.S. Pat. No. 6,541,300 discloses a process for preparing an organic semiconductor (OSC) film for use in an organic electronic (OE) device, by blending an OSC material with a multicomponent solvent blend and applying the resulting mixture to a substrate. It is claimed that the OSC film obtained by using a solvent blend has a higher mobility and the resulting OE device has a higher on/off ratio, compared to an OSC film, or an OE device including the OSC film, which are produced using only one solvent of the multicomponent solvent blend. However, the claimed process is characterized only by its desired result, i.e. a higher mobility and a higher on/off ratio, but not by the means how this result can be achieved. In particular, the document does not provide a clear guidance for the person skilled in the art how to select suitable solvents in order to achieve a workable formulation. The document only mentions that the solvents of the solvent blend should have a combined polarity ($\phi_m$) from 0.1 to 1.0. Apart from this parameter, however, the document does not provide any limitation or guidance regarding the choice of the OSC compound, and the choice of solvents that are best suitable for a chosen OSC compound. Although the document discloses a list of OSC compounds (including polymers and small molecules) and a list of solvents having a polarity ranging from low to high values, it is not clear if all these solvents will readily dissolve the disclosed OSC compounds. However, it is known that when a solvent does not dissolve an OSC material, the resulting mixture is often not suitable for the preparation of OSC films and OE devices, since the morphology of the resulting OSC film will deteriorate, which will negatively affect the OE device performance. Therefore, in view of the teaching of U.S. Pat. No. 6,541,300, considerable effort is still required to find the appropriate solvents for a given OSC material as disclosed in this document.

WO 03/069959 A1 discloses an OSC film for use in an electroluminescent (EL) device, formed by a wet film process with a composite solution. The composite solution is prepared by dissolving at least two organic compounds in a mixed organic solvent, including at least two organic solvents having different volatility and different solubility for the organic compounds. Again, the document discloses a large list of possible solvents and organic compounds, but does not provide a clear guidance how suitable solvents can be chosen for a given organic compound. Instead, it is merely said that the selection of the at least two organic solvents having different volatility may depend on the property of the organic compounds.

EP 1 416 069 A1 discloses an OSC element comprising a polyacene as OSC material. The document further mentions that the polyacene may be dissolved in a solvent, and that a combination of two or more solvents may be used. However, apart from a list of standard solvents no preference is given to any particular solvent or solvent combination, and no specific guidance is provided regarding the selection of suitable solvents.

WO 2005/041322 A1 discloses an organic polymer solution for use in OE devices comprising at least one organic polymer, a first solvent and a second solvent, wherein the first solvent has a low solubility and faster evaporation rate than the second solvent, and the second solvent has a very low solubility. Also claimed is a method of manufacturing an OE device by depositing the solution on an electrode and allowing it to dry. It is claimed that, due to the different solubility and evaporation rate of the solvents, a substantially uniform polymer layer is formed. However, no specific values or parameter ranges of the solvent properties are given, which could serve as a basis for the selection of suitable solvents.

EP 1 122 793 A2 discloses an organic luminescence device manufactured from an ink comprising an organic EL material and a hydrophobic organic solvent or solvent mixture, wherein the solvents have a dissolving power of at most 5 wt. % of water at room temperature. However, this value does apply to practically all OLED solvents known in the prior art and does therefore not constitute a real limitation. It is further mentioned that the ink should have a viscosity of not more than 5000 cp, preferably not more than 100 cp. However, there is no guidance how to select specific solvents to achieve these values. This makes the selection of suitable solvents still difficult, especially when trying to prepare dilute small molecule solutions having high viscosities, without using non-volatile thickening agents.

WO 03/053707 A2 discloses a screen printable EL polymer ink comprising a soluble EL material, an organic solvent having a boiling point between 120 and 200° C., and a viscosity enhancer to maintain a viscosity of above 50 cp. The organic solvent should preferably have a solubility parameter of between 8.8 and 10.0 $(cal/cm^3)^{1/2}$. The majority of viscosity modifiers mentioned in this document are polymers or inorganic particles, as for example disclosed on page 9 or 10. Further reported is the use of "gel retarders" in concentrations from 1 to 20%, which can also be commercially available products, to decrease solvent evaporation and improve ink stability and processability. However, the use of processing additives as suggested in this document is not always desirable in OSC printing inks for the preparation of OE devices, since these processing additives will remain in the OSC layer after removal of the solvent, where they could negatively affect or even destroy the performance of the device. Instead it is more preferable to have only the pure active OSC material left in the OSC layer after drying, without any processing additives. Therefore, apart of the active OSC material the ink should preferably contain only volatile components.

Solutions of small molecules in a solvent do not generally have a big effect on the viscosity of the resultant solution as occurs with polymers. Therefore, compositions for conventional printing applications like ink jet printing, flexographic or gravure printing need additives to increase ink viscosity and improve film formation. The prior art provides compositions being useful in order to process low molecular weight organic light emitting and charge transporting materials. However, it is a permanent desire to improve the performance of the OLED layer, such as efficiency, lifetime and sensitivity regarding oxidation or water.

It is therefore desirable to have fluids comprising light emitting materials and/or charge transporting materials that are suitable for the preparation of OLED devices, which allow the manufacture of high efficient OLED devices having a high performance, a long lifetime and a low sensitivity against water or oxidation. One aim of the present invention is to provide such improved fluids. Another aim is to provide improved methods of preparing an OLED device from such fluids. Another aim is to provide improved OLED devices obtained from such fluids and methods. Further aims are immediately evident to the person skilled in the art from the following description.

Surprisingly it has been found that these aims can be achieved, and the above-mentioned problems can be solved, by providing methods, materials and devices as claimed in the present invention, especially by providing a process for preparing an OLED device using a composition of the present invention.

SUMMARY OF THE INVENTION

The invention relates to a composition comprising one or more organic light emitting materials and/or charge transporting materials having a molecular weight of at most 5000 g/mol, and one or more organic solvents, characterized in that said solvent comprises a viscosity at 25° C. of at least 10 mPas and the boiling point of the solvent is at most 400° C.

The invention further relates to the use of a composition as described above and below as coating or printing ink for the preparation of OLED devices, in particular for rigid and flexible OLED devices.

The invention further relates to a process of preparing an organic light emitting diode (OLED) device, comprising the steps of
a) depositing a composition as described above and below onto a substrate, preferably to form a film or layer,
b) removing the solvent(s), for example by evaporation.

The invention further relates to an OLED device prepared from a composition and/or by a process as described above and below.

OLED devices can for example be used for illumination, for medical illumination purposes, as signalling devices, as signage devices, and in displays. Displays can be addressed using passive matrix driving, total matrix addressing or active matrix driving. Transparent OLEDs can be manufactured by using optically transparent electrodes. Flexible OLEDs are assessable through the use of flexible substrates.

The compositions, methods and devices of present invention provide surprising improvements in the efficiency of the OLED devices and the production thereof. Unexpectedly, the performance, the lifetime and the efficiency of the OLED devices can be improved, if these devices are achieved by using a composition of the present invention. Furthermore, the composition of the present invention provides an astonishingly high level of film forming. Especially, the homogeneity and the quality of the films can be improved. In addition thereto, the compositions of the present invention comprise high amounts of organic light emitting materials and/or charge transporting materials and still have viscosities that are suitable for the desired printing or coating technique.

A BRIEF DESCRIPTION OF THE FIGURES

DETAILED DESCRIPTION OF THE INVENTION

Figure 1:
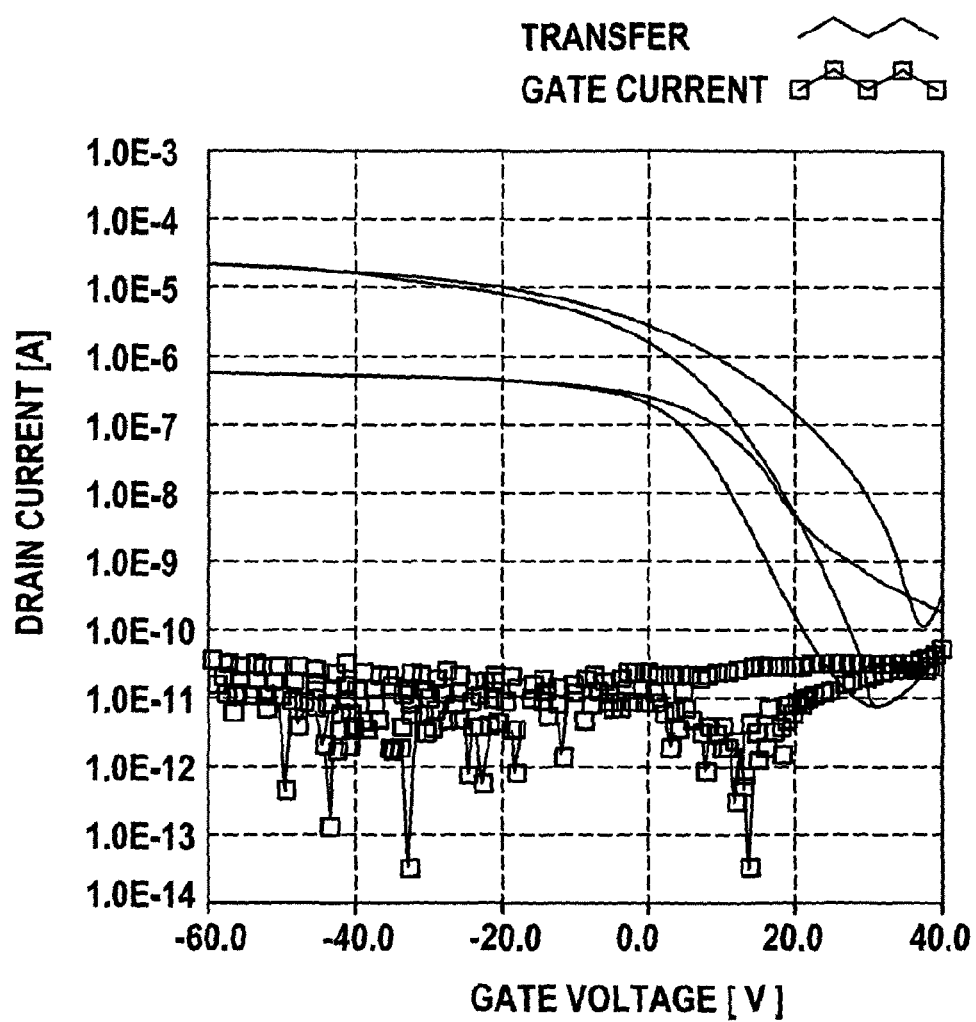
FIGS. 1 and 2 depict the transistor characteristic and the linear and saturation mobility of the device.

The present composition comprises at least one organic light emitting material and/or charge transporting material having a molecular weight of at most 5000 g/mol. The organic light emitting materials and/or charge transporting materials can be selected from standard materials known to the skilled person and described in the literature. Preferably, the composition comprises an organic light emitting material. Organic light emitting material according to the present application means a material which emits light having a $\lambda_{max}$ in the range from 400 to 700 nm.

The composition according to the present invention can comprise between 0.01 and 20% by weight, preferably between 0.1 and 15% by weight, more preferably between 0.2 and 10% by weight and most preferably between 0.25 and 5% by weight, of the organic light emitting materials and/or charge transporting materials or the corresponding blend. The percent data relate to 100% of the solvent or solvent mixture.

The light emitting material or the charge transporting material (below together named as organic semiconductor) used here is either a pure component or a mixture of two or more components. The organic light emitting materials and/or charge transporting materials preferably include phosphorescent compounds.

Suitable phosphorescent compounds are, in particular, compounds which emit light, preferably in the visible region, on suitable excitation and in addition contain at least one atom having an atomic number greater than 20, preferably greater than 38 and less than 84, more preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic phosphorescent compounds are compounds of formulae (1) to (4):

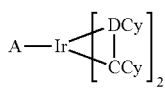  formula (1)

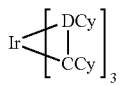  formula (2)

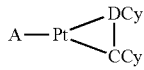  formula (3)

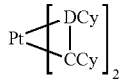  formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals.

Formation of ring systems between a plurality of radicals $R^1$ means that a bridge may also be present between the groups DCy and CCy. Furthermore, formation of ring systems between a plurality of radicals $R^1$ means that a bridge may also be present between two or three ligands CCy-DCy or between one or two ligands CCy-DCy and the ligand A, giving a polydentate or polypodal ligand system.

Examples of the emitters described above are revealed by the applications WO 00/070655, WO 01/041512, WO 02/002714, WO 02/015645, EP 1191613, EP 1191612, EP 1191614, WO 04/081017, WO 05/033244, WO 05/042550, WO 05/113563, WO 06/008069, WO 06/061182, WO 06/081973 and DE 102008027005. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.

Examples of preferred phosphorescent compounds are shown in the following table.

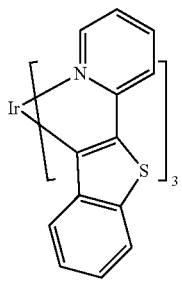

(1)

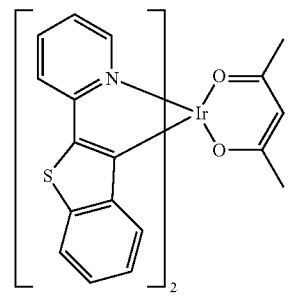

(2)

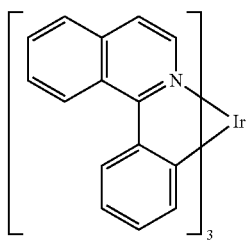

(3)

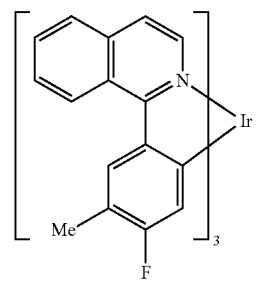

(4)

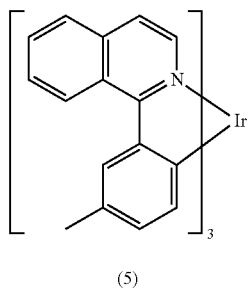
(5)
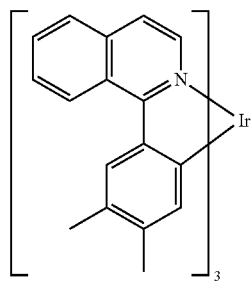
(6)
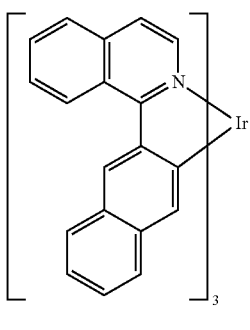
(7)
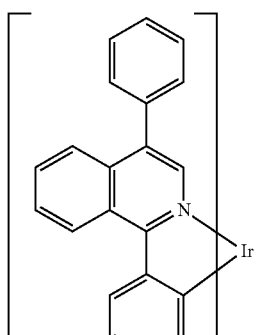
(8)
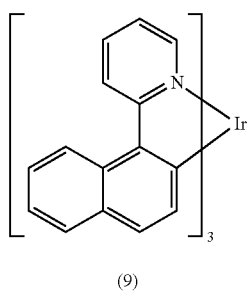
(9)
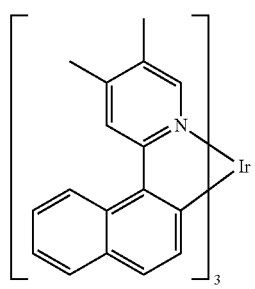
(10)
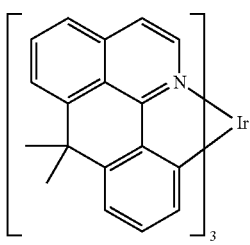
(11)
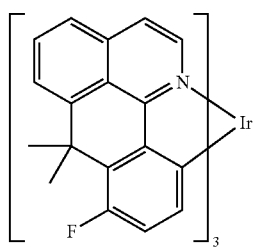
(12)

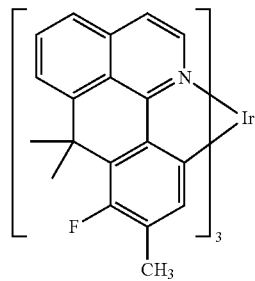
(13)
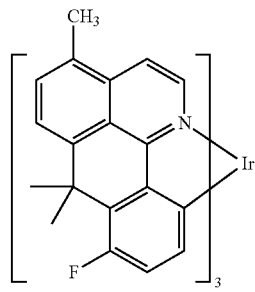
(14)
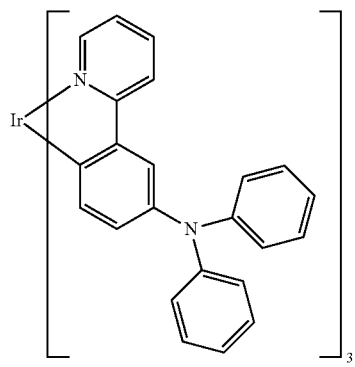
(15)
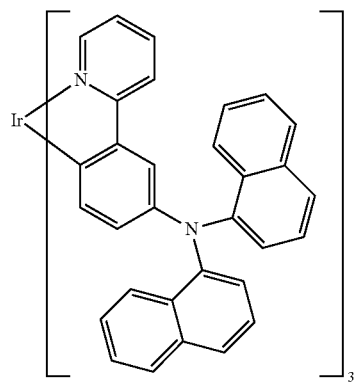
(16)
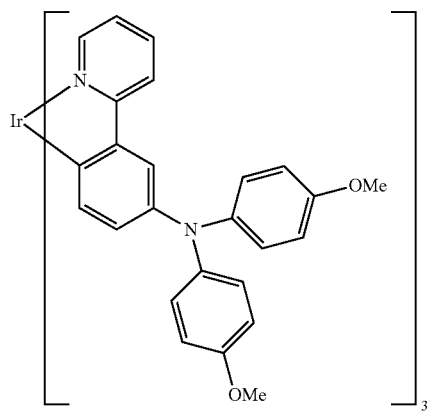
(17)
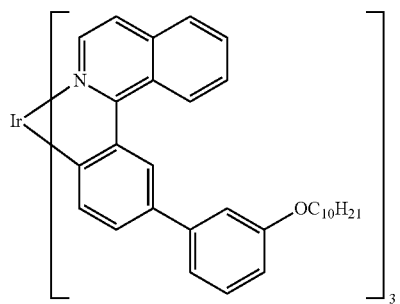
(18)

-continued
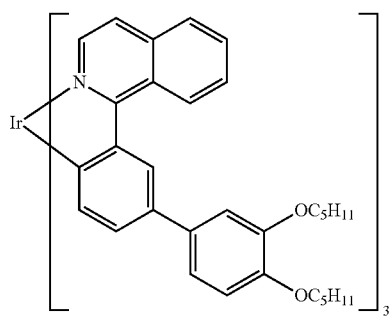
(19)
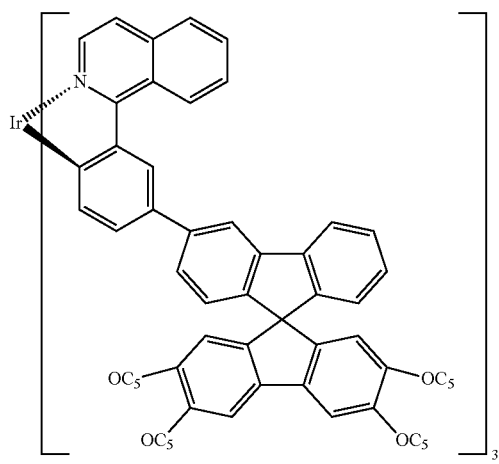
(20)
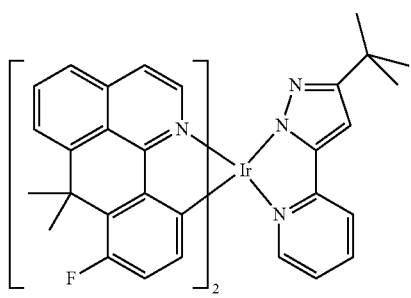
(21)
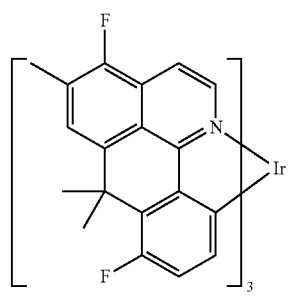
(22)
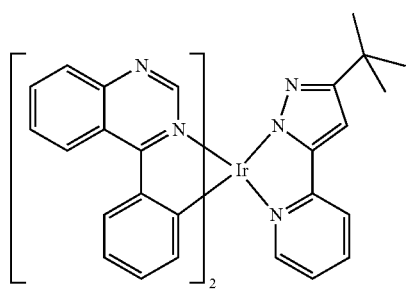
(23)
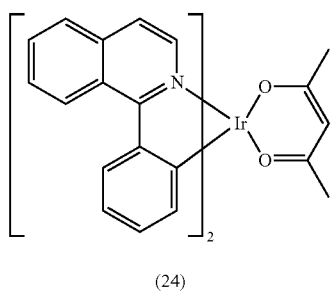
(24)
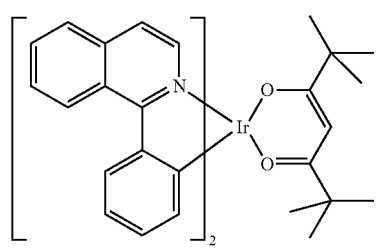
(25)
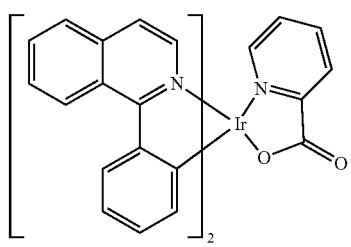
(26)

-continued
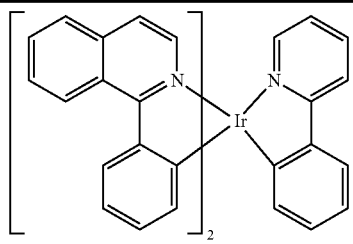
(27)
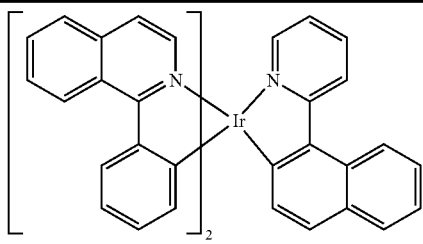
(28)
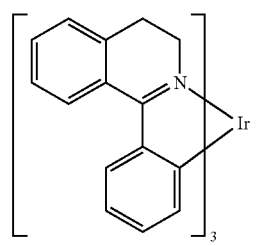
(29)
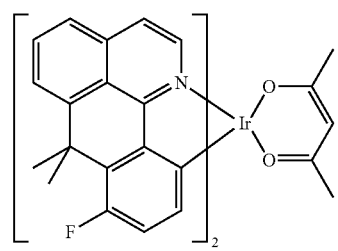
(30)
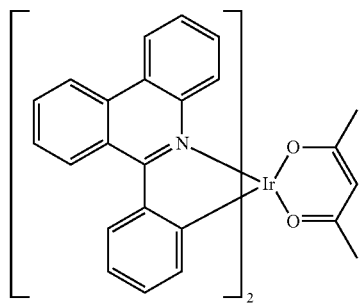
(31)
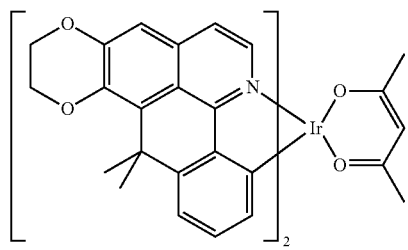
(32)
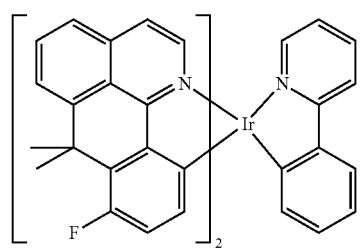
(33)
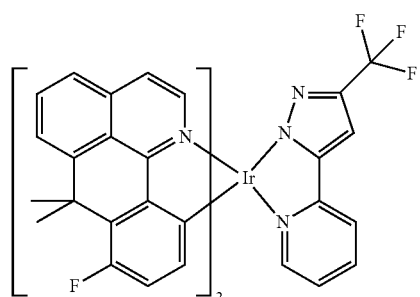
(34)

-continued
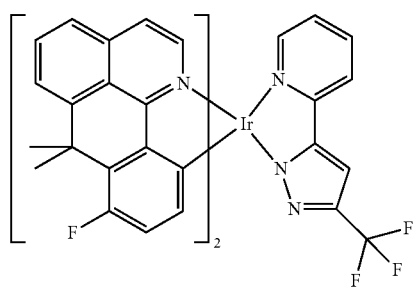
(35)
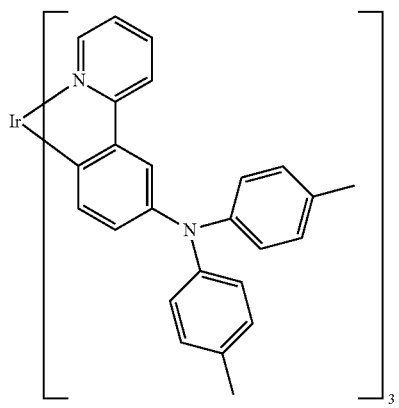
(36)
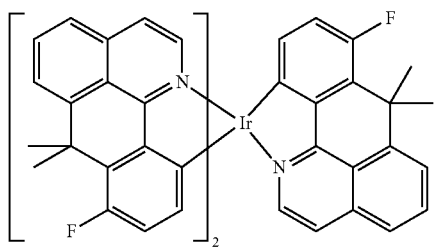
(37)
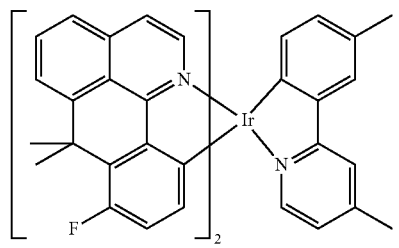
(38)
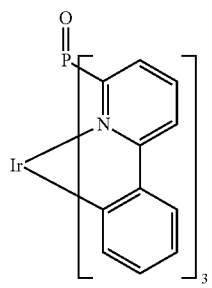
(39)
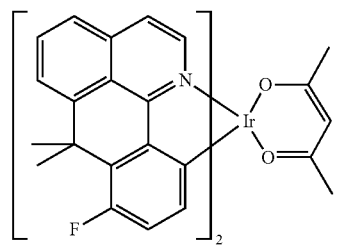
(40)
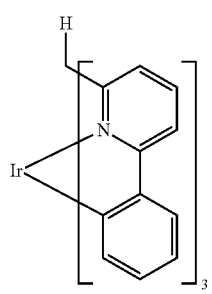
(41)
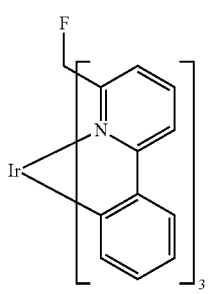
(42)

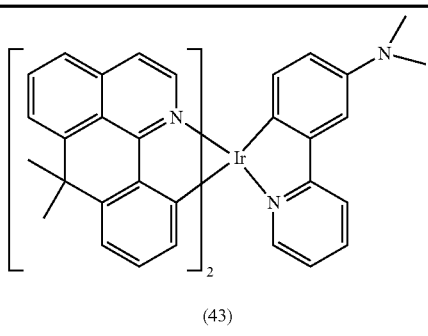
(43)
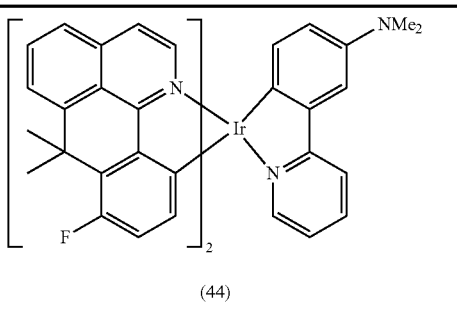
(44)
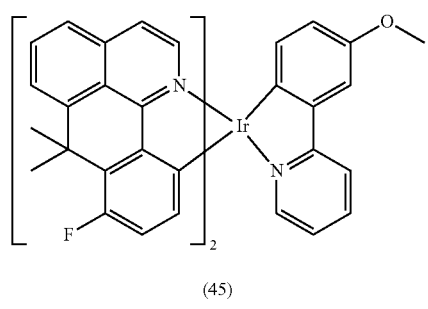
(45)
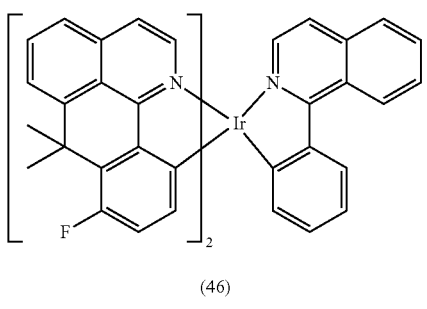
(46)
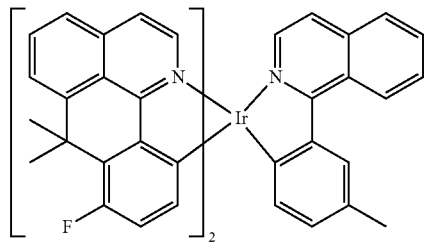
(47)
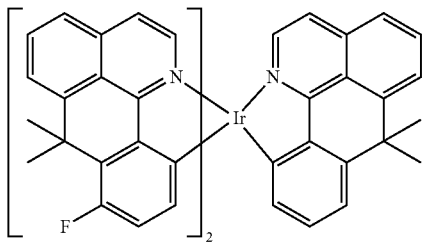
(48)
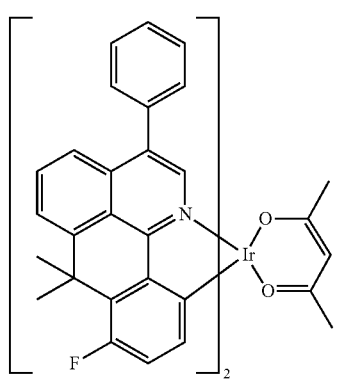
(49)
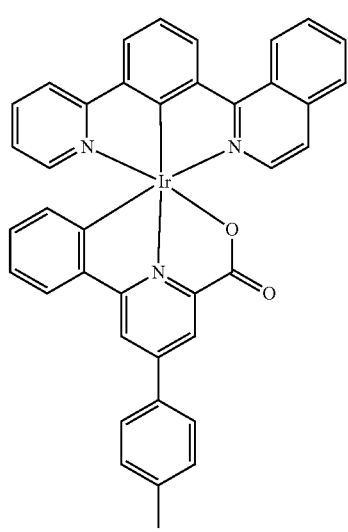
(50)

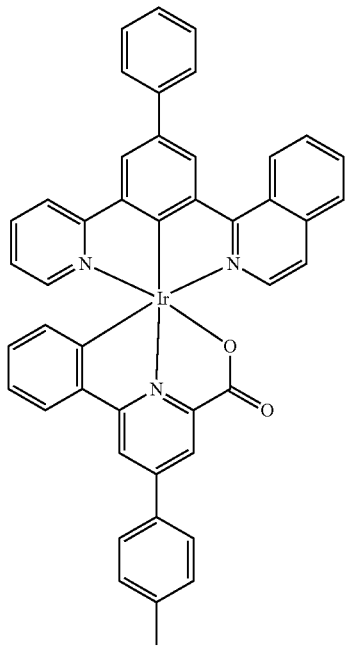
(51)
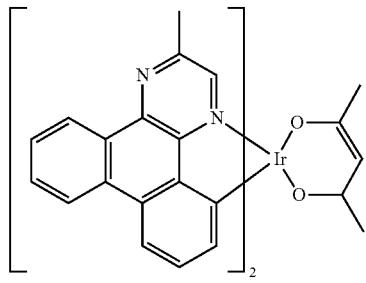
(52)
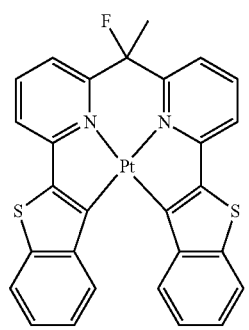
(53)
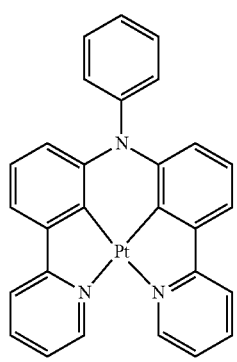
(54)
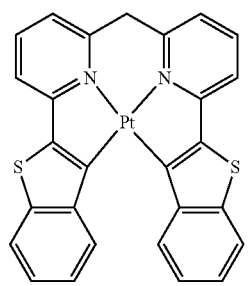
(55)
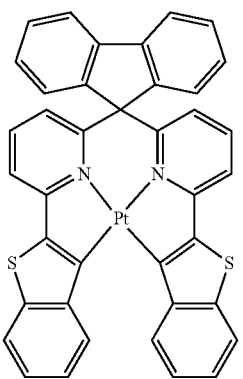
(56)

-continued
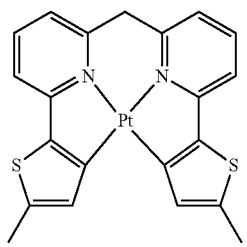
(57)
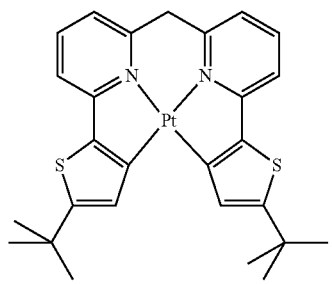
(58)
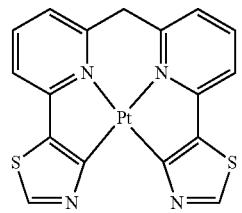
(59)
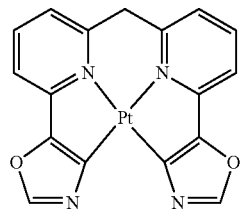
(60)
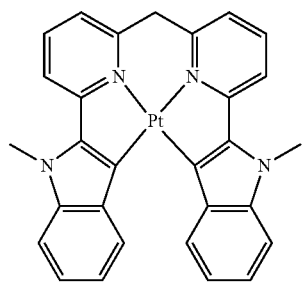
(61)
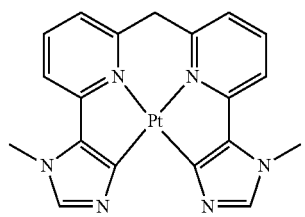
(62)
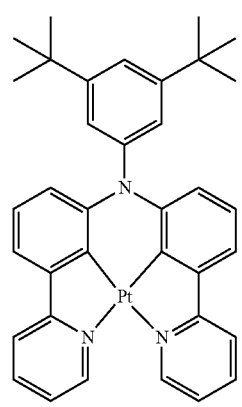
(63)
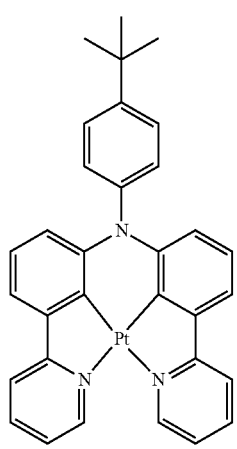
(64)

-continued
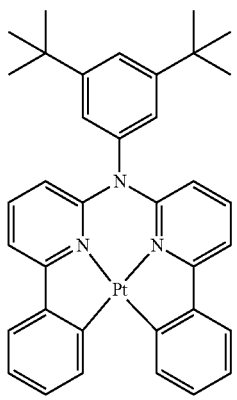
(65)
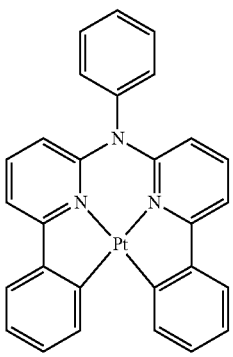
(66)
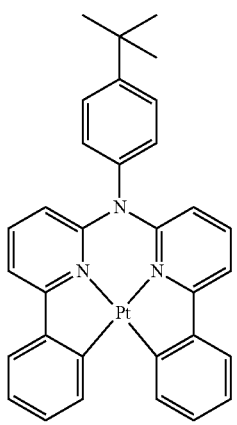
(67)
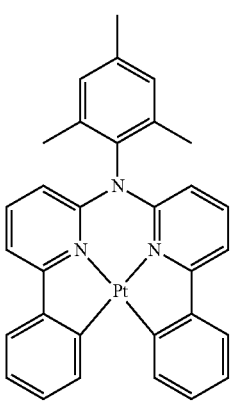
(68)
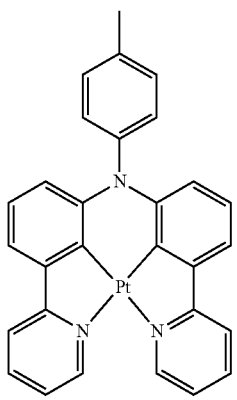
(69)
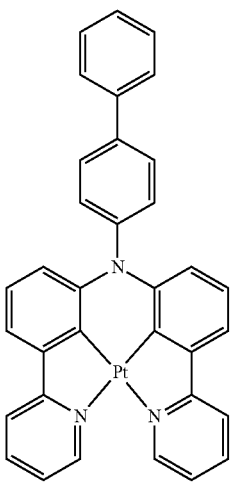
(70)

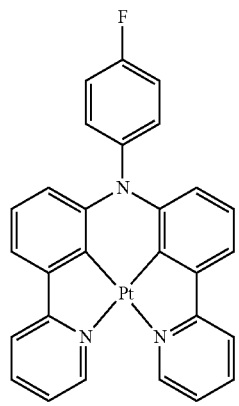
(71)
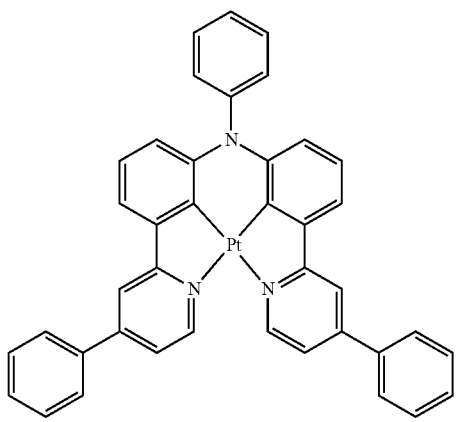
(72)
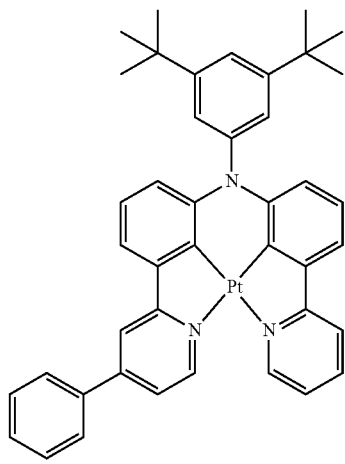
(73)
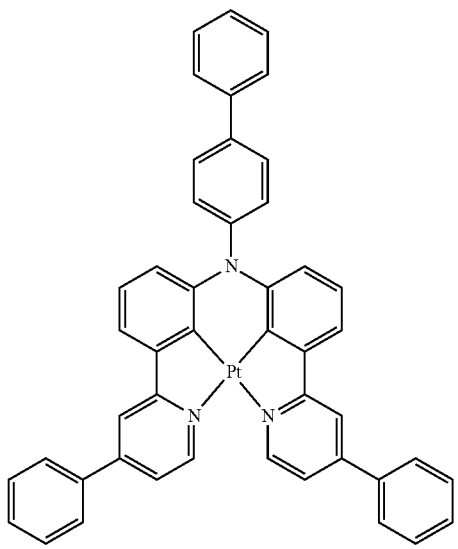
(74)
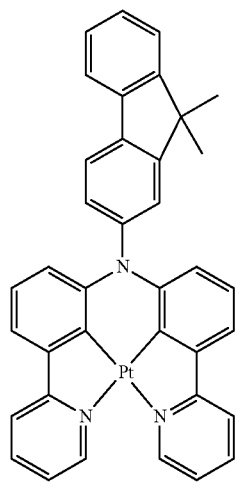
(75)
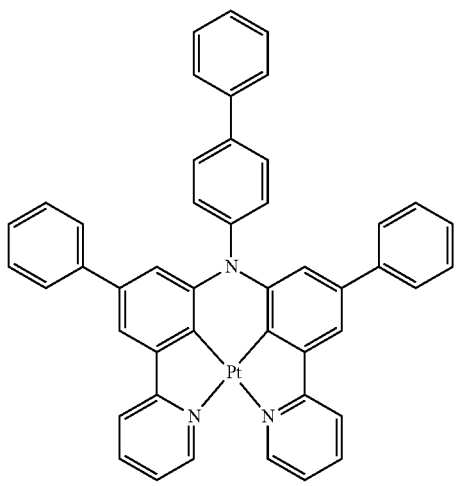
(76)

-continued
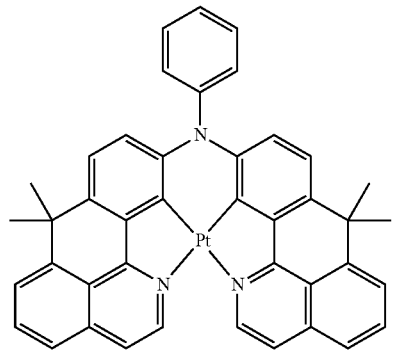
(77)
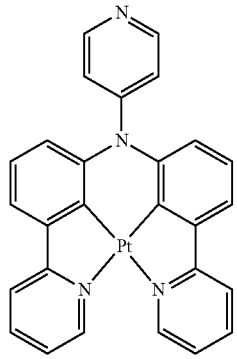
(78)
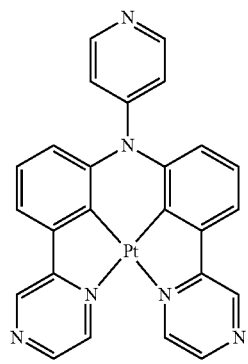
(79)
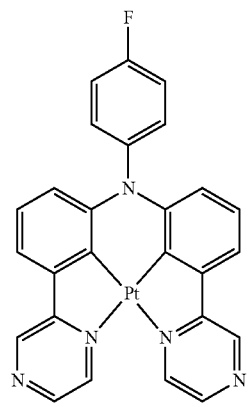
(80)
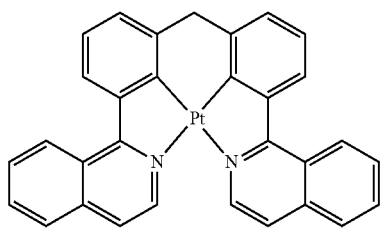
(81)
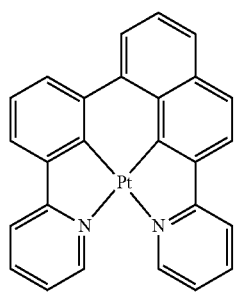
(82)
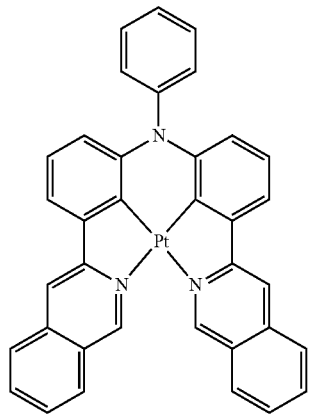
(83)
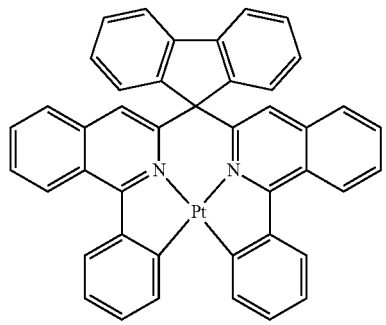
(84)

-continued
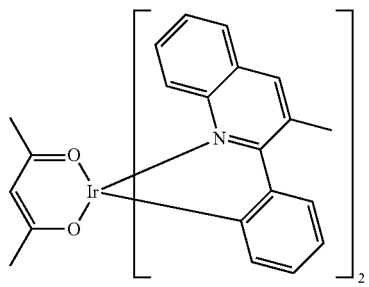
(85)
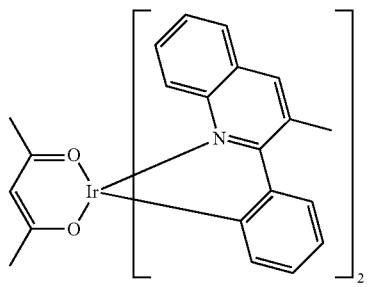
(86)
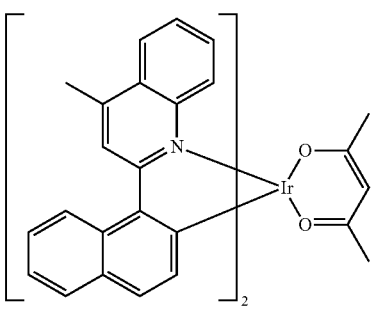
(87)
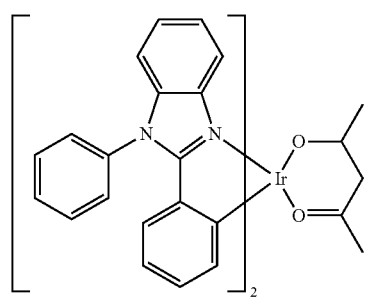
(88)
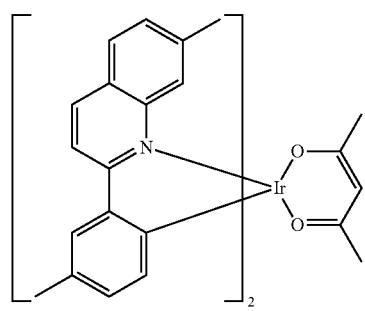
(89)
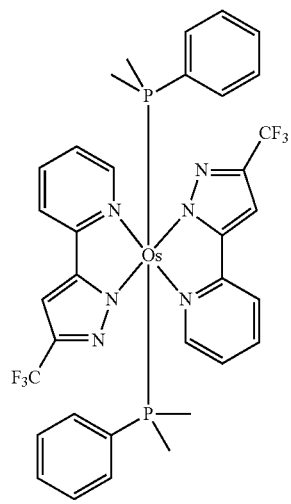
(90)
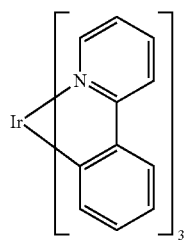
(91)
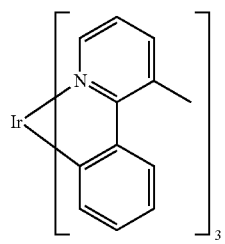
(92)

-continued
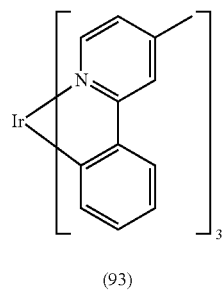
(93)
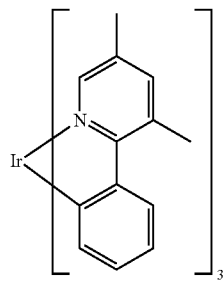
(94)
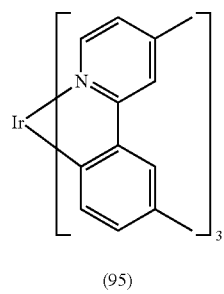
(95)
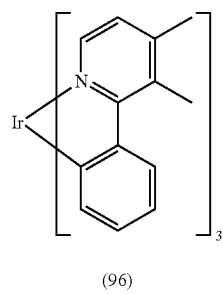
(96)
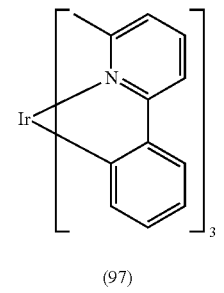
(97)
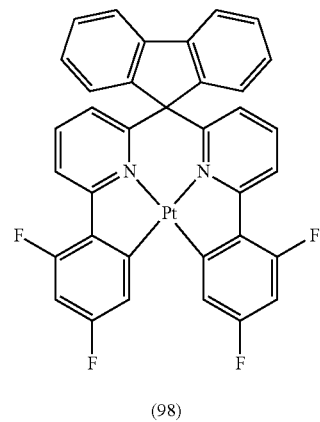
(98)
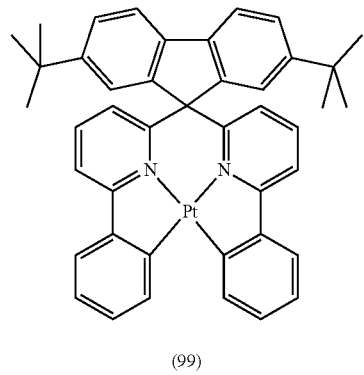
(99)
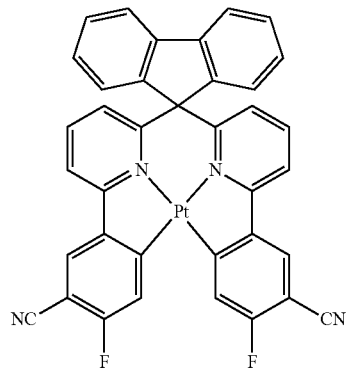
(100)

-continued
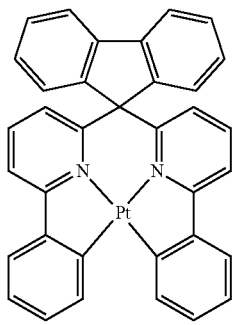
(101)
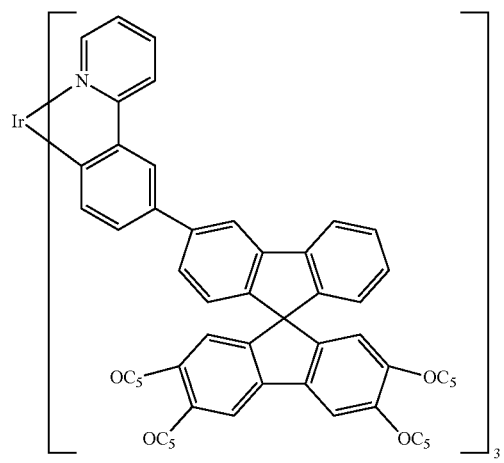
(102)
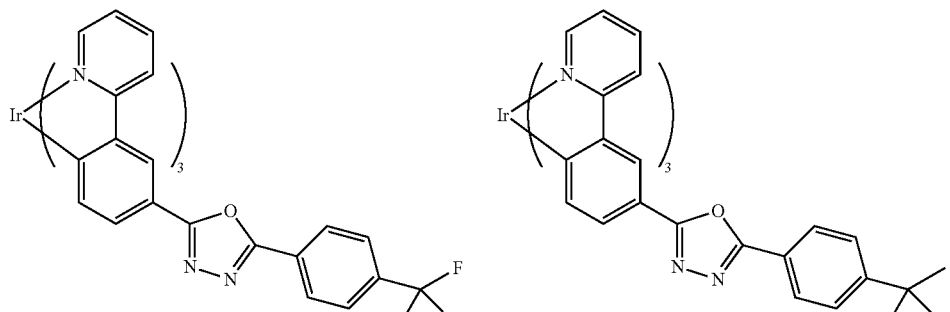
(103)  (104)
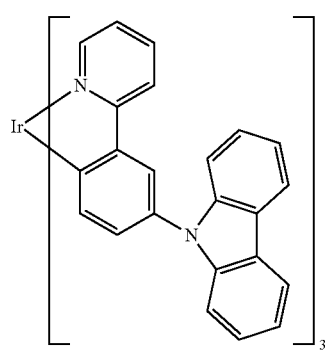
(105)
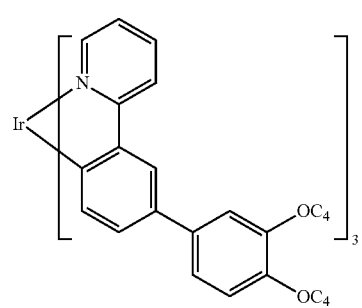
(106)

-continued
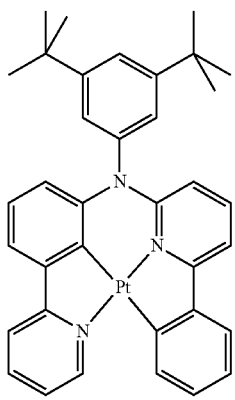
(107)
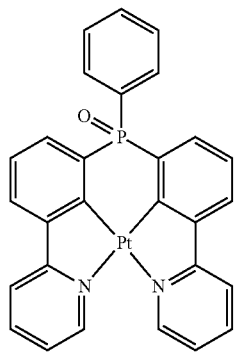
(108)
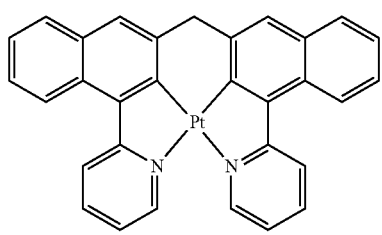
(109)
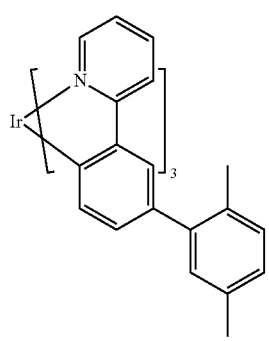
(110)
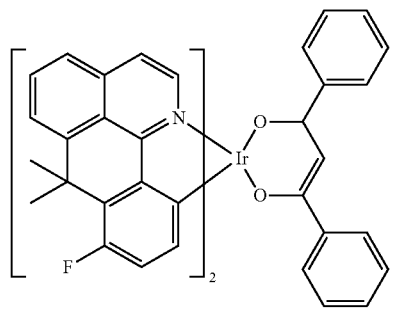
(111)
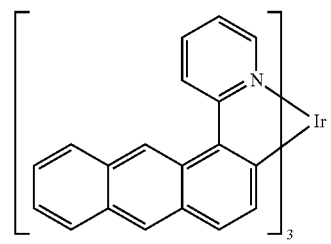
(112)
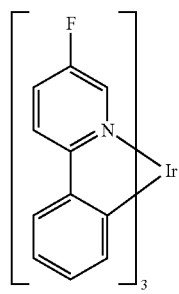
(113)
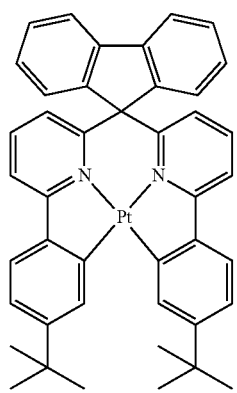
(114)

-continued
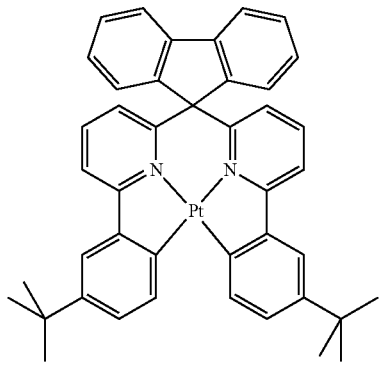
(115)
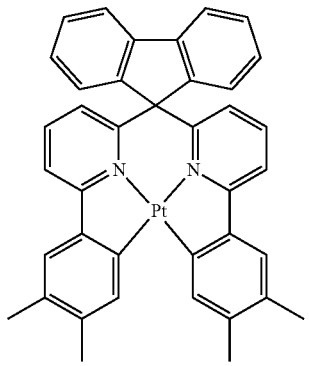
(116)
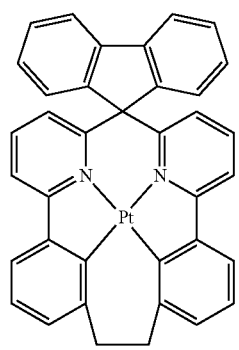
(117)
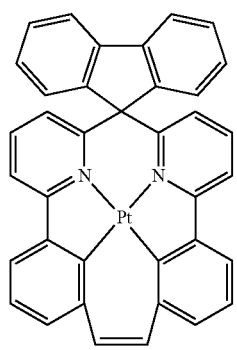
(118)
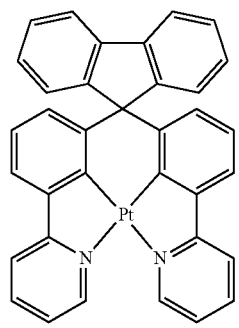
(119)
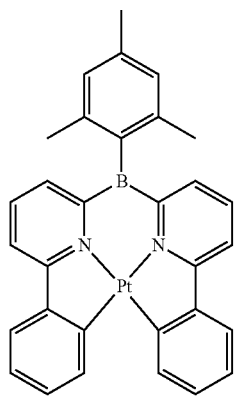
(120)

-continued
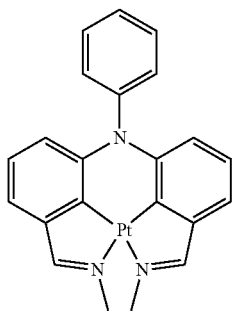
(121)
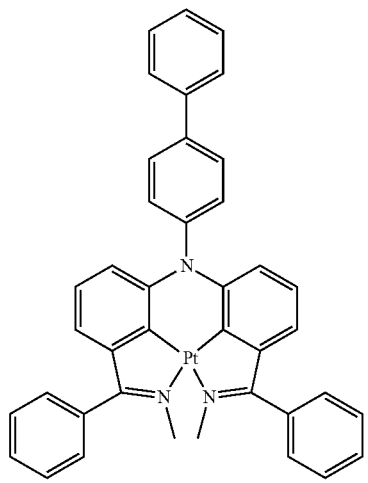
(122)
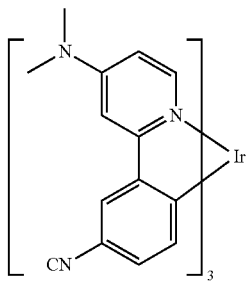
(123)
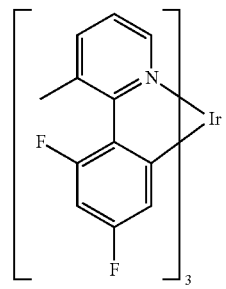
(124)
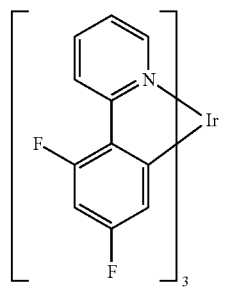
(125)
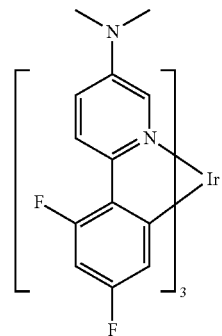
(126)
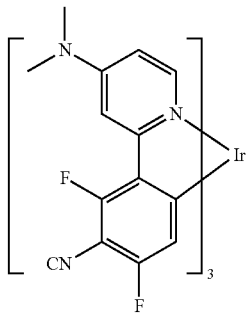
(127)
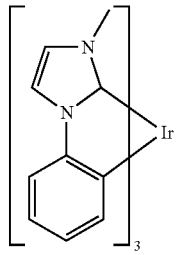
(128)

-continued
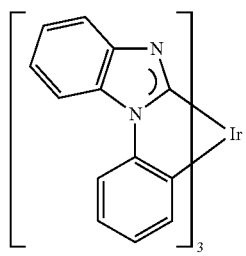
(129)
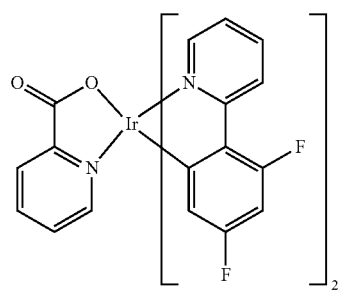
(130)
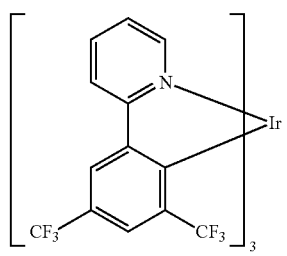
(131)
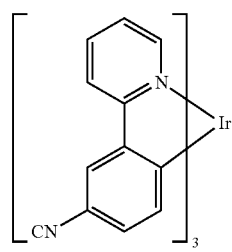
(132)
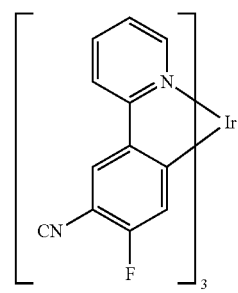
(133)
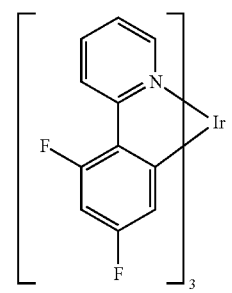
(134)
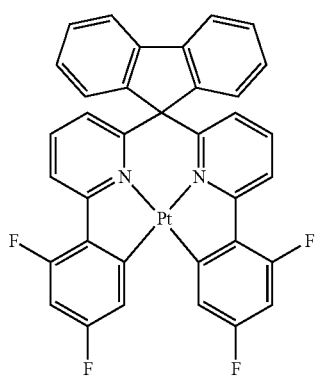
(135)
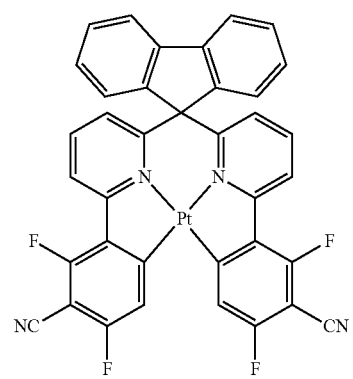
(136)

-continued

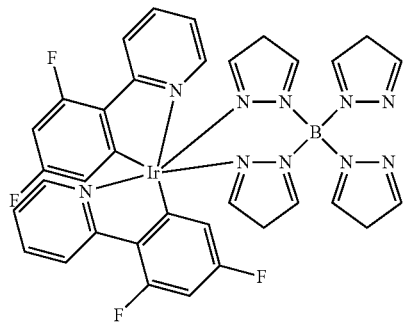

(137)

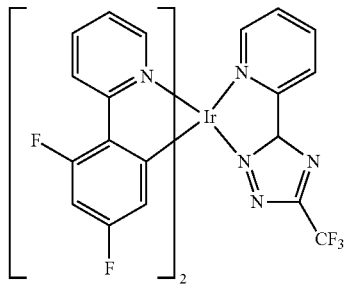

(138)

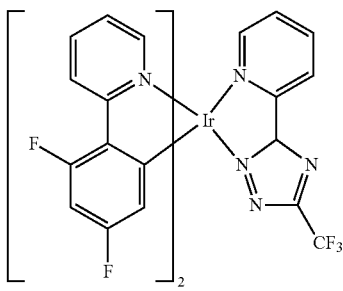

(139)

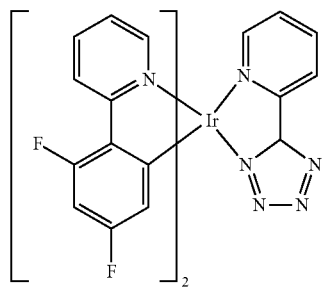

(140)

Preferred dopants are selected from the class of the monostyrylamines, the distyrylamines, the tristyrylamines, the tetrastyrylamines, the styryl-phosphines, the styryl ethers and the arylamines. A monostyrylamine is taken to mean a compound which contains one substituted or unsubstituted styryl group and at least one, preferably aromatic, amine. A distyryl-amine is taken to mean a compound which contains two substituted or un-substituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of the present invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthraceneamines, aromatic anthracenediamines, aromatic pyreneamines, aromatic pyrene-diamines, aromatic chryse-neamines or aromatic chrysenediamines. An aromatic anthraceneamine is taken to mean a compound in which one di-arylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyreneamines, pyrenediamines, chryseneamines and chrysenediamines are defined analogously thereto, where the diarylamino groups are preferably bonded to the pyrene in the 1-position or in the 1,6-position. Further preferred dopants are selected from indenofluoreneamines or indenofluorene-diamines, for example in accordance with WO 06/122630, benzoindeno-fluoreneamines or benzoindenofluorenediamines, for example in accordance with WO 08/006,449, and dibenzoindenofluoreneamines or dibenzo-indenofluorenediamines, for example in accordance with WO 07/140,847. Examples of dopants from the class of the styrylamines are substituted or unsubstituted tristilbeneamines or the dopants described in WO 06/000388, WO 06/058737, WO 06/000389, WO 07/065,549 and WO 07/115,610. Preference is furthermore given to the condensed hydrocarbons disclosed in DE 102008035413.

Suitable dopants are furthermore the structures depicted in the following table, and the derivatives of these structures disclosed in JP 06/001973, WO 04/047499, WO 06/098080, WO 07/065,678, US 2005/0260442 and WO 04/092111.

(141)
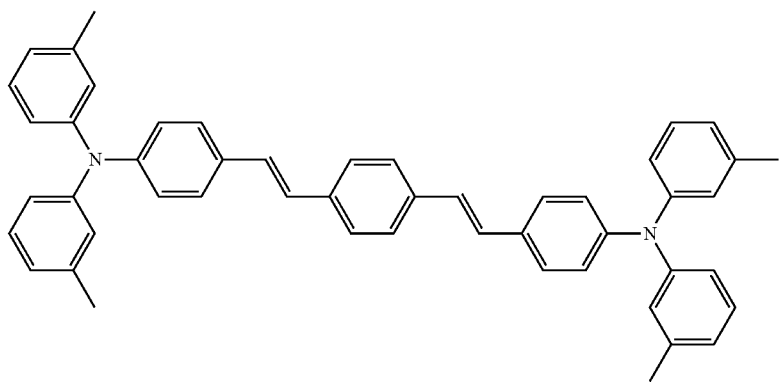 [SMILES: Cc1cccc(N(c2ccc(/C=C/c3ccc(/C=C/c4ccc(N(c5cccc(C)c5)c5cccc(C)c5)cc4)cc3)cc2)c2cccc(C)c2)c1]
(142)
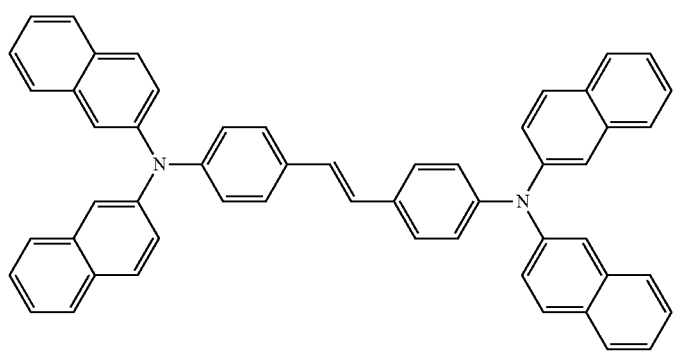 [SMILES: C(=C\c1ccc(N(c2ccc3ccccc3c2)c2ccc3ccccc3c2)cc1)/c1ccc(N(c2ccc3ccccc3c2)c2ccc3ccccc3c2)cc1]
(143)
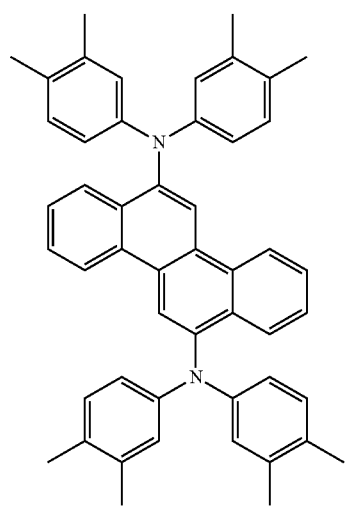

(144)

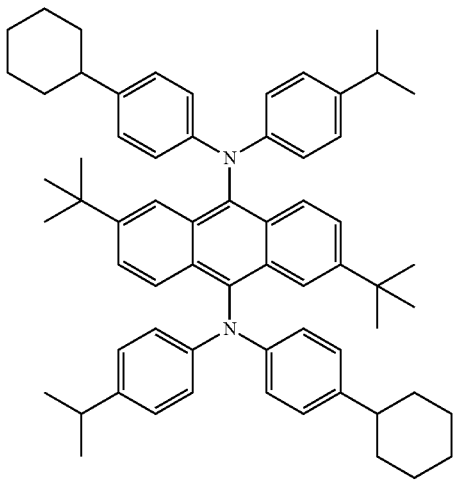 [SMILES: CC(C)c1ccc(N(c2ccc(C3CCCCC3)cc2)c2c3ccc(C(C)(C)C)cc3c(N(c3ccc(C(C)C)cc3)c3ccc(C4CCCCC4)cc3)c3ccc(C(C)(C)C)cc23)cc1]

(145)

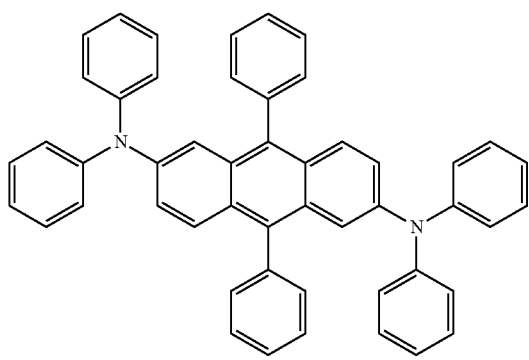 [SMILES: c1ccc(-c2c3ccc(N(c4ccccc4)c4ccccc4)cc3c(-c3ccccc3)c3ccc(N(c4ccccc4)c4ccccc4)cc23)cc1]

(146)

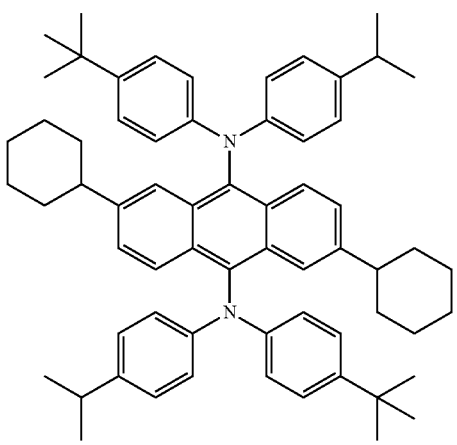 [SMILES: CC(C)c1ccc(N(c2ccc(C(C)(C)C)cc2)c2c3ccc(C4CCCCC4)cc3c(N(c3ccc(C(C)C)cc3)c3ccc(C(C)(C)C)cc3)c3ccc(C4CCCCC4)cc23)cc1]

The proportion of the dopant in the mixture of the emitting layer is between 0.1 and 50.0% by weight, preferably between 0.5 and 20.0% by weight, particularly preferably between 1.0 and 10.0% by weight. Correspondingly, the proportion of the host material is between 50.0 and 99.9% by weight, preferably between 80.0 and 99.5% by weight, particularly preferably between 90.0 and 99.0% by weight.

Suitable host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylene-vinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (for example in accordance with WO 08/145,239). Suitable host materials are furthermore also the benzo[c]phenanthrene compounds according to the invention which are described above. Apart from the compounds according to the invention, particularly preferred host materials are selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the benzo[c]phenanthrene compounds according to the invention, very particularly preferred host materials are selected from the classes of the oligoarylenes containing anthracene, benzanthracene and/or pyrene or atropisomers of these compounds. For the purposes of this invention, an oligoarylene is intended to be taken to mean a compound in which at least three aryl or arylene groups are bonded to one another.

Suitable host materials are furthermore, for example, the materials depicted in the following table, and derivatives of these materials, as disclosed in WO 04/018587, WO 08/006,449, U.S. Pat. No. 5,935,721, US 2005/0181232, JP 2000/273056, EP 681019, US 2004/0247937 and US 2005/0211958.

(147)

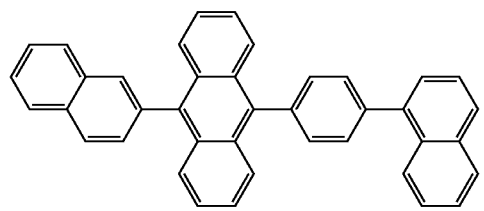 [SMILES: c1ccc2cc(-c3c4ccccc4c(-c4ccc(-c5cccc6ccccc56)cc4)c4ccccc34)ccc2c1]

(148)

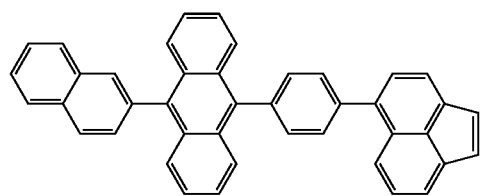 [SMILES: C1=Cc2ccc(-c3ccc(-c4c5ccccc5c(-c5ccc6ccccc6c5)c5ccccc45)cc3)c3cccc1c23]

(149)

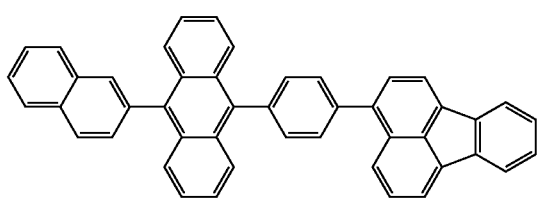 [SMILES: c1ccc2c(c1)-c1cccc3c(-c4ccc(-c5c6ccccc6c(-c6ccc7ccccc7c6)c6ccccc56)cc4)ccc-2c13]

(150)

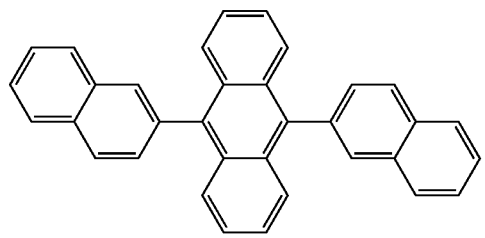 [SMILES: c1ccc2cc(-c3c4ccccc4c(-c4ccc5ccccc5c4)c4ccccc34)ccc2c1]

(151)

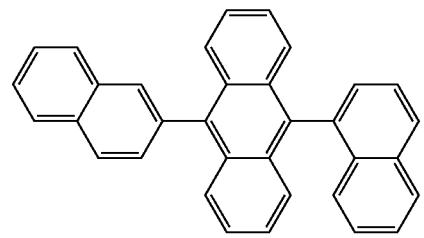 [SMILES: c1ccc2cc(-c3c4ccccc4c(-c4cccc5ccccc45)c4ccccc34)ccc2c1]

(152)

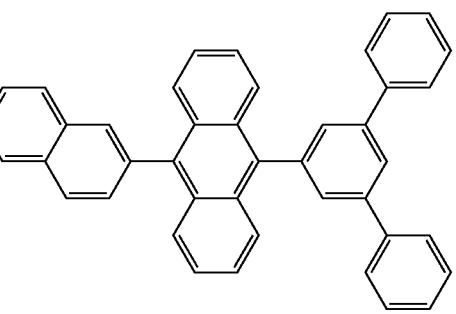

(153)

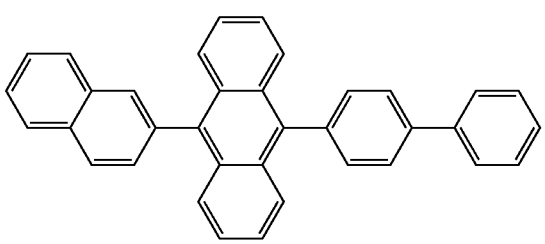 [SMILES: c1ccc(-c2ccc(-c3c4ccccc4c(-c4ccc5ccccc5c4)c4ccccc34)cc2)cc1]

(154)
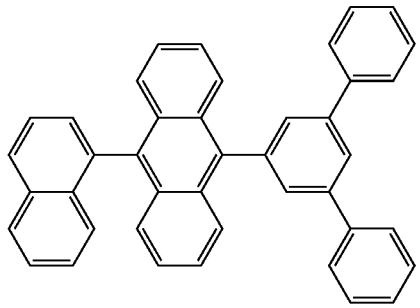 [SMILES: c1ccc(-c2cc(-c3ccccc3)cc(-c3c4ccccc4c(-c4cccc5ccccc45)c4ccccc34)c2)cc1]

(155)
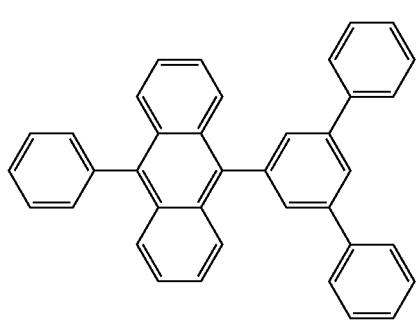 [SMILES: c1ccc(-c2cc(-c3ccccc3)cc(-c3c4ccccc4c(-c4ccccc4)c4ccccc34)c2)cc1]

(156)
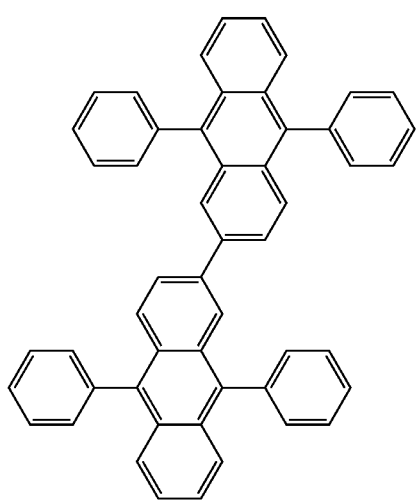 [SMILES: c1ccc(-c2c3ccccc3c(-c3ccccc3)c3cc(-c4ccc5c(-c6ccccc6)c6ccccc6c(-c6ccccc6)c5c4)ccc23)cc1]

(157)
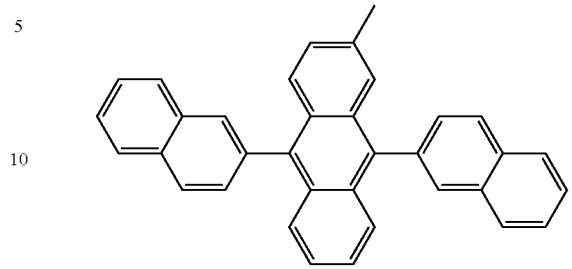

(158)
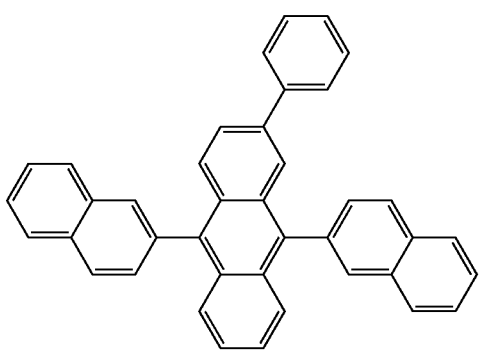 [SMILES: c1ccc(-c2ccc3c(-c4ccc5ccccc5c4)c4ccccc4c(-c4ccc5ccccc5c4)c3c2)cc1]

For the purposes of this invention, a hole-injection layer is a layer which is directly adjacent to the anode. For the purposes of this invention, a hole-transport layer is a layer which is located between a hole-injection layer and an emission layer. It may be preferred for them to be doped with electron-acceptor compounds, for example with $F_4$-TCNQ or with compounds as described in EP 1476881 or EP 1596445.

Apart from the materials according to the invention, suitable charge-transport materials, as can be used in the hole-injection or hole-transport layer or in the electron-injection or electron-transport layer of the organic electroluminescent device according to the invention, are, for example, the compounds disclosed in Y. Shirota et al., *Chem. Rev.* 2007, 107(4), 953-1010, or other materials as employed in these layers in accordance with the prior art.

Examples of preferred hole-transport materials which can be used in a hole-transport or hole-injection layer of the electroluminescent device according to the invention are indenofluoreneamines and derivatives (for example in accordance with WO 06/122630 or WO 06/100896), the amine derivatives as disclosed in EP 1661888, hexaazatriphenylene derivatives (for example in accordance with WO 01/049806), amine derivatives with condensed aromatics (for example in accordance with U.S. Pat. No. 5,061,569), the amine derivatives as disclosed in WO 95/09147, monobenzoindeno-fluoreneamines (for example in accordance with WO 08/006, 449) or dibenzoindenofluoreneamines (for example in accordance with WO 07/140,847). Suitable hole-transport and hole-injection materials are furthermore derivatives of the compounds depicted above, as disclosed in JP 2001/226331, EP 676461, EP 650955, WO 01/049806, U.S. Pat. No. 4,780,536, WO 98/030071, EP 891121, EP 1661888, JP 2006/253445, EP 650955, WO 06/073054 and U.S. Pat. No. 5,061,569.

Suitable hole-transport or hole-injection materials are furthermore, for example, the materials indicated in the following table.

(159)
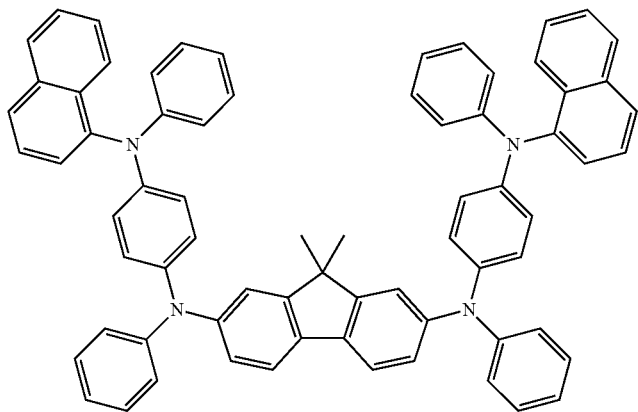 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]
(160)
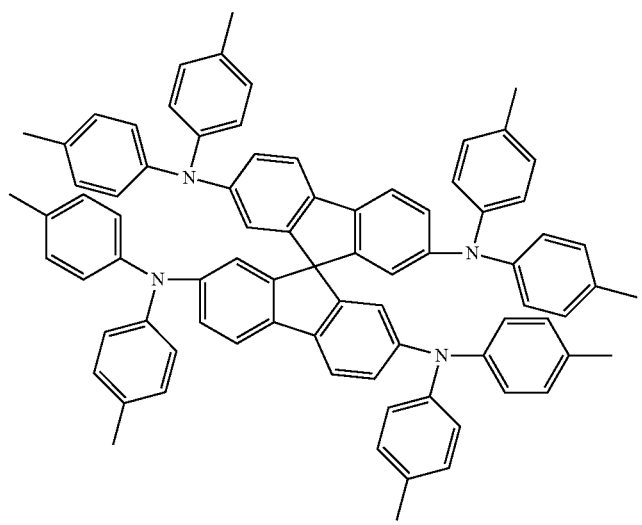
(161)
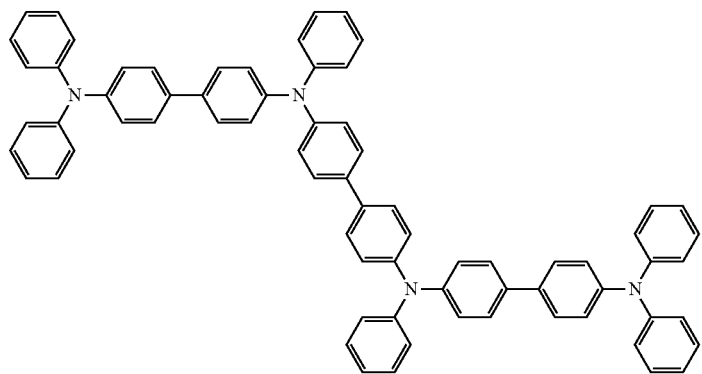 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]

(162)
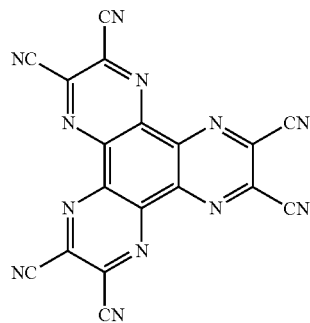 [SMILES: N#Cc1nc2c3nc(C#N)c(C#N)nc3c3nc(C#N)c(C#N)nc3c2nc1C#N]
(163)
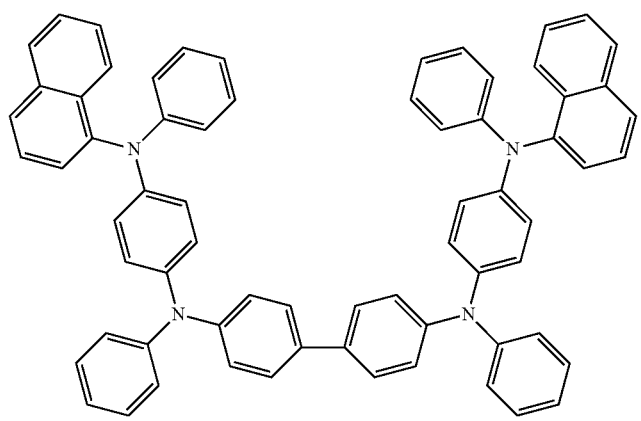 [SMILES: c1ccc(N(c2ccc(-c3ccc(N(c4ccccc4)c4ccc(N(c5ccccc5)c5cccc6ccccc56)cc4)cc3)cc2)c2ccc(N(c3ccccc3)c3cccc4ccccc34)cc2)cc1]
(164)
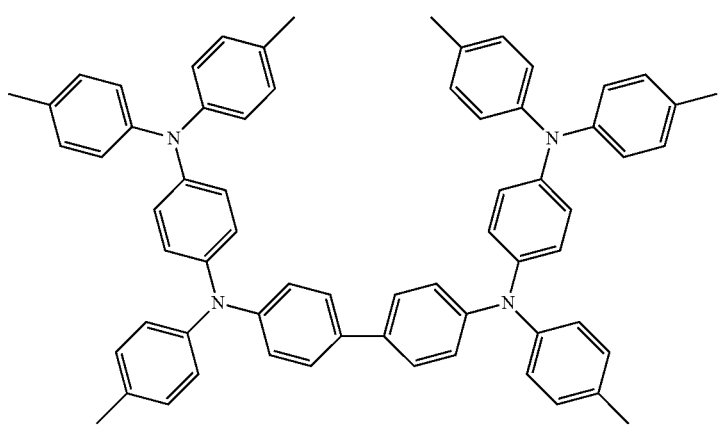

-continued
(165)
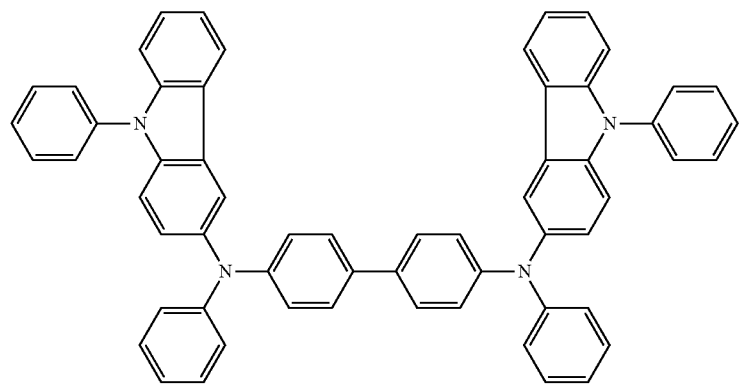 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
(166)
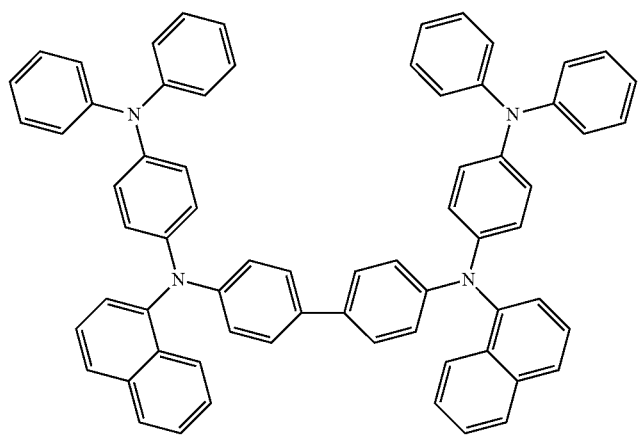 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
(167)
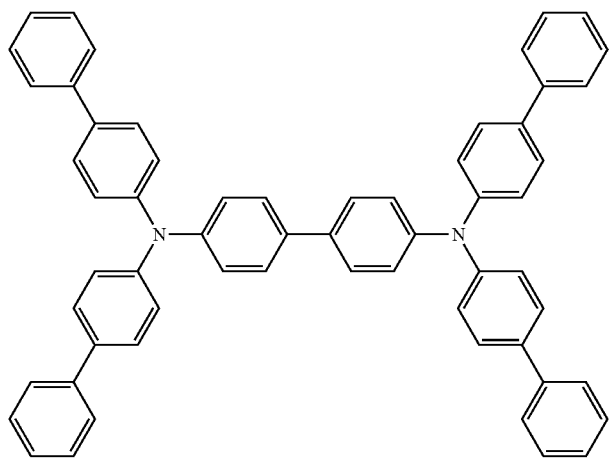 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(168)
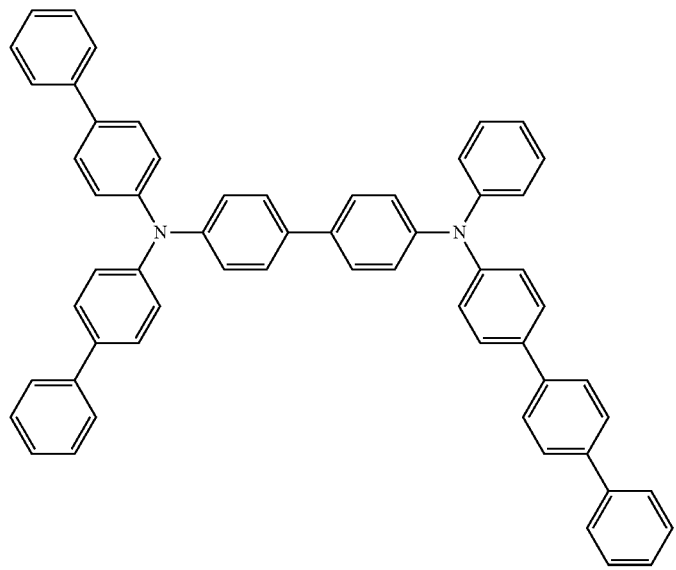 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
(169)
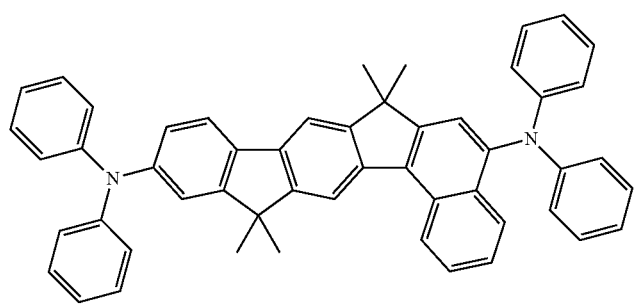 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
(170)
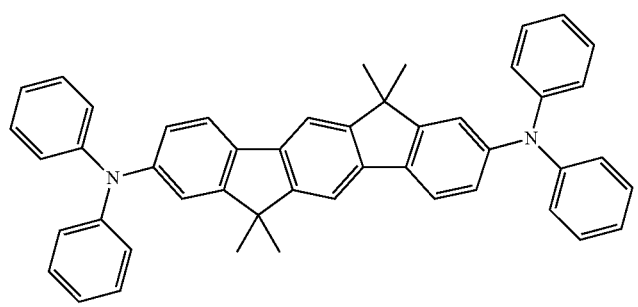 [SMILES: CC1(C)c2cc(N(c3ccccc3)c3ccccc3)ccc2-c2cc3c(cc21)-c1ccc(N(c2ccccc2)c2ccccc2)cc1C3(C)C]

(171)
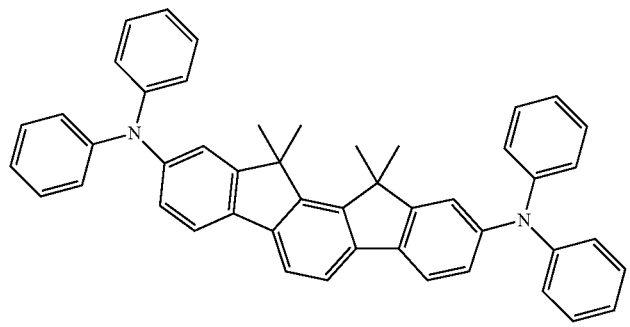 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
(172)
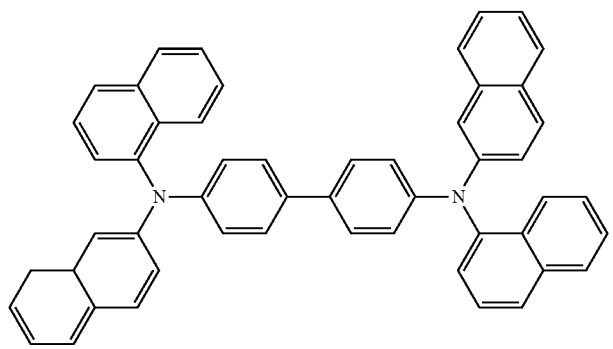 [SMILES: C1=CCC2C=C(N(c3ccc(-c4ccc(N(c5ccc6ccccc6c5)c5cccc6ccccc56)cc4)cc3)c3cccc4ccccc34)C=CC2=C1]
(173)
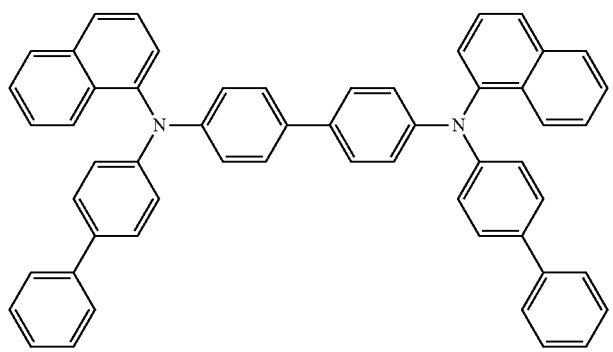 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
(174)
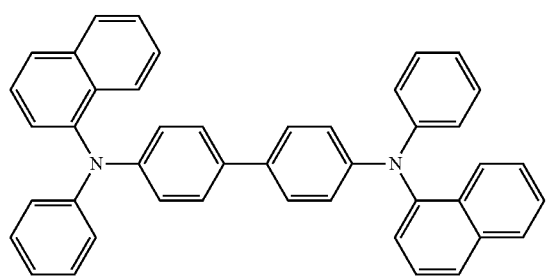 [SMILES: c1ccc(N(c2ccc(-c3ccc(N(c4ccccc4)c4cccc5ccccc45)cc3)cc2)c2cccc3ccccc23)cc1]

(175)
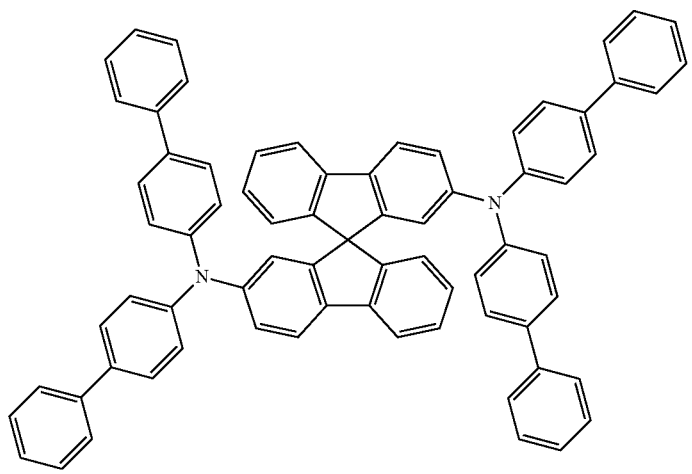 [SMILES: c1ccc(-c2ccc(N(c3ccc(-c4ccccc4)cc3)c3ccc4c(c3)C3(c5ccccc5-4)c4ccccc4-c4ccc(N(c5ccc(-c6ccccc6)cc5)c5ccc(-c6ccccc6)cc5)cc43)cc2)cc1]
(176)
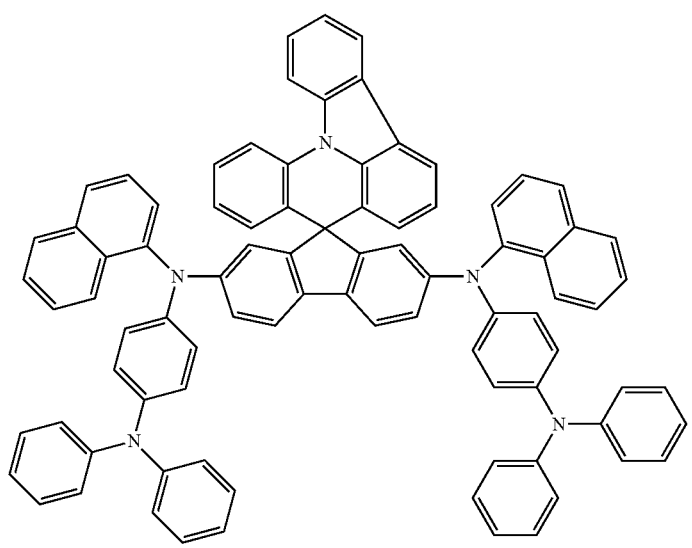 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]

Suitable electron-transport or electron-injection materials which can be used in the electroluminescent device according to the invention are, for example, the materials indicated in the following table. Suitable electron-transport and electron-injection materials are furthermore derivatives of the compounds depicted above, as disclosed in JP 2000/053957, WO 03/060956, WO 04/028217 and WO 04/080975.

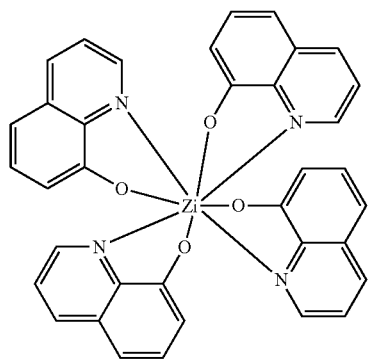

(177)

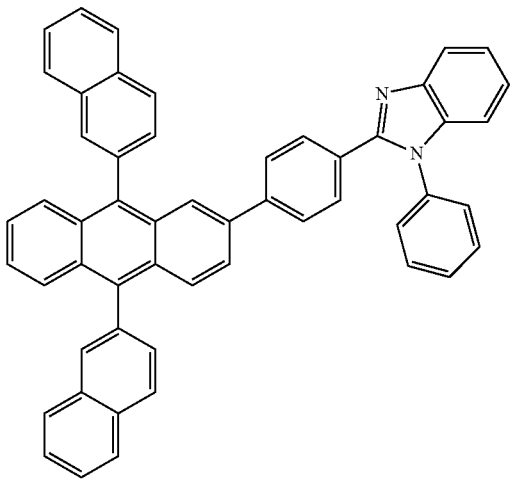 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

(178)

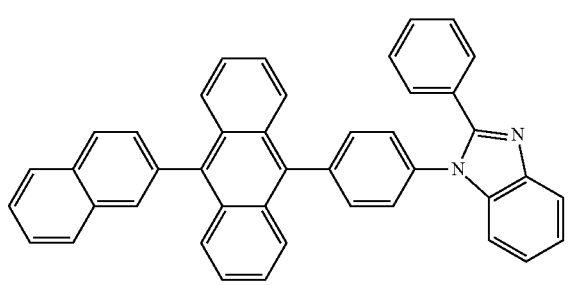 [SMILES: c1ccc(-c2nc3ccccc3n2-c2ccc(-c3c4ccccc4c(-c4ccc5ccccc5c4)c4ccccc34)cc2)cc1]

(179)

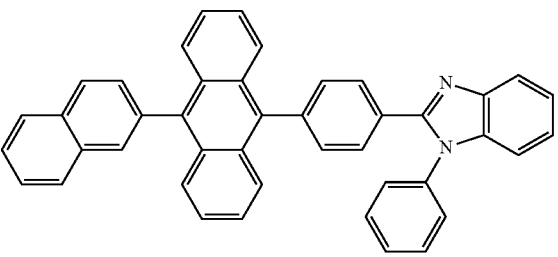 [SMILES: c1ccc(-n2c(-c3ccc(-c4c5ccccc5c(-c5ccc6ccccc6c5)c5ccccc45)cc3)nc3ccccc32)cc1]

(180)

Suitable matrix materials for the compounds according to the invention are ketones, phosphine oxides, sulfoxides and sulfones, for example in accordance with WO 04/013080, WO 04/093207, WO 06/005627 or DE 102008033943, triarylamines, carbazole derivatives, for example CBP (N,N-biscarbazolylbiphenyl) or the carbazole derivatives disclosed in WO 05/039246, US 2005/0069729, JP 2004/288381, EP 1205527 or WO 08/086,851, indolocarbazole derivatives, for example in accordance with WO 07/063,754 or WO 08/056,746, azacarbazoles, for example in accordance with EP 1617710, EP 1617711, EP 1731584, JP 2005/347160, bipolar matrix materials, for example in accordance with WO 07/137,725, silanes, for example in accordance with WO 05/111172, azaboroles or boronic esters, for example in accordance with WO 06/117052, triazine derivatives, for example in accordance with DE 102008036982, WO 07/063,754 or WO 08/056,746, or zinc complexes, for example in accordance with DE 102007053771.

With further preferences charge transporting materials can be used having a triacene structure, such as anthracene and phenanthrene structures. Triacene structure means a condensed aromatic hydrocarbon structure having exactly three condensed aromatic rings. Regarding this embodiment of the present invention, triacene structures do not include tetracene or pentacene structures.

The light emitting materials and/or charge transporting materials have a molecular weight of at most 5000 g/mol, preferably at most 2000 g/mol, especially at most 1500 g/mol and more preferably at most 1000 g/mol.

According to a special embodiment of the present invention, the composition can comprise 0.1 to 10% by weight, preferably 0.25 to 5% by weight, more preferably 0.5 to 4% by weight emitting materials and/or charge transporting materials.

In addition to the organic light emitting materials and/or charge transporting materials the composition of the present invention comprises at least one organic solvent having a viscosity at 25° C. of at least 10 mPas and a boiling point of at most 400° C.

Preferably, the viscosity of the solvent or the solvent blend ranges from 10 to 700 mPas, especially from 15 to 630 mPas and more preferably from 30 to 500 mPas at room temperature (25° C.). The viscosity values are measured with a parallel plate rotational viscometer or rheometer (TA Instruments) at a shear rate of 500 s$^{-1}$, unless stated otherwise.

Inks made up from these solvents can then be diluted down with lower viscosity solvents, if desired, to tune the viscosities as needed, as long as the viscosity of the entire solvent blend is >10 mPas.

The solvent has a boiling point or sublimation temperature of <400° C., preferably ≤350° C., more preferably ≤300° C., most preferably ≤250° C., at the pressure employed, very preferably at atmospheric pressure (1013 hPa). Evaporation can also be accelerated e.g. by applying heat and/or reduced pressure.

Further preferably the boiling point of the solvent, or of the lowest boiling solvent of the solvent blend, is at least 130° C., more preferably at least 150° C. at atmospheric pressure (1013 hPa).

According to a preferred embodiment of the present invention, the logarithm of the partition ratio log P of the solvent, or the weighted average of the partition ratio (log P)$_W$ of the solvent blend is >1.5, more preferably >2 and most preferably >2.5. Preferably these values relate to the calculated log P for each solvent.

The partition ratio log P (in the literature also referred to as "partition coefficient") of a compound or solvent is given by equation (1)

$$\log P = \log([A]_{oct}/[A]_{aq}) \quad (1)$$

wherein $[A]_{oct}$ is the concentration of the compound or solvent in octanol and $[A]_{aq}$ is the concentration of the compound or solvent in water.

(See IUPAC Compendium of Chemical Terminology, Electronic version, http://goldbook.iupac.org/P04440.html, PAC 1993, 65, 2385, and C. Hansch, Acc. Chem. Res. 2, 232, (1969)).

In case of a solvent blend, which comprises two or more solvents, the partition ratio of the blend is defined as the weighted average (log P)$_w$ of the partition ratios of all solvents contained in the blend, as given by equation (2)

$$(\log P)_w = \sum_{i=1}^{n} w_i \log P_i \quad (2)$$

with n being the number of solvents, log P$_i$ being the log P value of a single solvent in the solvent blend, and w$_i$ being the weight fraction (concentration in % by weight/100) of said solvent in the solvent blend.

The log P values are measured by measuring the concentration in each phase (e.g. by GC, HPLC, UV/vis etc.) after equilibrating a dilute solution in equal volumes of water and octanol. For a rough estimation log P can be calculated by molecular calculation using "Chem Bio Draw Ultra version 11.0 (2007)" software, produced and marketed by Cambridge Soft., unless stated otherwise.

Preferred organic solvents can comprise Hansen Solubility parameters of H$_d$ in the range of 17.0 to 23.2 MPa$^{0.5}$, H$_p$ in the range of 0.2 to 12.5 MPa$^{0.5}$ and H$_h$ in the range of 0.9 to 14.2 MPa$^{0.5}$. More preferred organic solvents comprise Hansen Solubility parameters of H$_d$ in the range of 18.5 to 21.0 MPa$^{0.5}$, H$_p$ in the range of 2.0 to 6.0 MPa$^{0.5}$ and H$_h$ in the range of 2.0 to 6.0 MPa$^{0.5}$.

The Hansen Solubility Parameters can be determined according to the Hansen Solubility Parameters in Practice (HSPiP) program (2$^{nd}$ edition) as supplied by Hanson and Abbot et al.

The solvents can generally be selected from any chemical class that meets the physical criteria mentioned above, including, but not limited to, aliphatic or aromatic hydrocarbons, amines, thiols, amides, esters, ethers, polyethers, alcohols, diols and polyols. Suitable and preferred solvents include for example 1-cyclohexyl-2-pyrrolidinone (N-cyclohexyl-pyrrolidinone), methylated benzenes like o-, m- or p-xylene.

Preferably the organic solvent comprises a cyclic alcohol and/or alicyclic alcohol, especially alkyl cyclohexanols, particularly methylated alicyclic alcohols (3- or 4-methylcyclohexanol or 2,5-dimethylcyclohexanol), naphthols like decahydro-2-naphthol or 1,2,3,4-tetrahydro-1-naphthol, terpenoids like α-terpineol, menthol or carveol, nonylphenol, 1-indanol, and 2-indanol.

Preferred solvents with high viscosity include for example decahydro-2-naphthol and 1,2,3,4-tetrahydro-1-naphthol. Suitable solvents with low viscosity that can be additionally used, include for example methylated benzenes like o-, m- or p-xylene, tetralin and decalin.

According to a preferred embodiment of the present invention, the solvent is a mixture of solvents. Especially preferred is a solvent blend comprising one or more solvents having a high viscosity and one or more solvents having a low viscosity. Solvents having a viscosity at 25° C. of at least 10 mPas, preferably at least 50 mPas, and <10 000 mPas, preferably <5000 mPas are considered as solvents having a high viscosity. Solvents having a high viscosity include, but are not limited to, decahydro-2-naphthol and 1,2,3,4-tetrahydro-1-naphthol. Solvents having a viscosity at 25° C. of <10 mPas are considered as solvents having a low viscosity. Solvents having a low viscosity include, but are not limited to, tetralin, decalin, and methyllated benzenes, like for example o-, m- or p-xylene. Additional solvents having high and low viscosities are mentioned in Table 1, respectively.

Most preferred are binary blends o-xylene/decahydro-2-naphthol with a ratio from 5/95 to 40/60, furthermore binary blends tetralin/1,2,3,4-tetrahydro-1-naphthol with a ratio from 25/75 to 50/50, furthermore binary blends decalin/decahydro-2-naphthol with a ratio from 25/75 to 50/50 (all ratios given in wt. %), especially the binary blends shown in Table 1.

TABLE 1

Viscosities, log P and boiling points of useful solvents

| Solvent [wt. %][3] | Viscosity[1] [cp] | log P[2] or (log P)$_w$[3] | B.p./ Max. b.p. in ° C. |
|---|---|---|---|
| α-terpineol | 36.5 (31° C.) | 2.6209 | 218 |
| decahydro-2-naphthol | 630 | 2.699 | 109 at 14 mmHg |
| 2% o-xylene 98% decahydro-2-naphthol | 396 | 2.708 | |
| 5% o-xylene 95% decahydro-2-naphthol | 231 | 2.721 | |
| 10% o-xylene 90% decahydro-2-naphthol | 124 | 2.743 | |
| 15% o-xylene 85% decahydro-2-naphthol | 82.7 | 2.765 | |
| 20% o-xylene 80% decahydro-2-naphthol | 52.7 | 2.787 | |
| 25% o-xylene 75% decahydro-2-naphthol | 34.9 | 2.809 | |
| 30% o-xylene 70% decahydro-2-naphthol | 30.3 | 2.831 | |
| 40% o-xylene 60% decahydro-2-naphthol | 20.8 | 2.875 | |
| o-xylene | 0.76 | 3.14 | 144 |
| N-cyclohexyl-pyrrolidinone | 10.4 | 2.103 | 284 |
| 3-methylcyclohexanol | 22.9 | 1.786 | 163 |
| 1,2,3,4-tetrahydro-1-naphthol | 192 | 1.777 | 102 at 2 mmHg |
| 2,5-dimethylcyclohexanol | 25 | 2.305 | 176 |
| 4-methylcyclohexanol | 37 | 1.786 | 170 |
| 25% tetralin, 75% 1,2,3,4-tetrahydro-1-naphthol | 25 | 2.261 | |
| 35% tetralin, 65% 1,2,3,4-tetrahydro-1-naphthol | 13.5 | 2.455 | |
| 40% tetralin, 60% 1,2,3,4-tetrahydro-1-naphthol | 11.0 | 2.552 | |

TABLE 1-continued

Viscosities, log P and boiling points of useful solvents

| Solvent [wt. %][3] | Viscosity[1] [cp] | log P[2] or (log P)$_w$[3] | B.p./ Max. b.p. in ° C. |
|---|---|---|---|
| 50% tetralin, 50% 1,2,3,4-tetrahydro-1-naphthol | 7.0 | 2.746 | |
| Tetralin | 2.0 | 3.714 | 207 |
| 25% decalin, 75% decahydro-2-naphthol | 48 | 3.203 | |
| 50% decalin, 50% decahydro-2-naphthol | 10 | 3.742 | |
| Decalin | 2.3 | 4.786 | 187 |

[1] at 25° C., unless stated otherwise
[2] for single solvent
[3] for solvent blends These solvents can be used as mixture of two, three or more.

The composition of the present invention can preferably comprise at least 70% by weight, more preferably at least 80% by weight and most preferably at least 90% by weight of organic solvents.

The composition according to the present invention may additionally comprise one or more further components like for example surface-active compounds, lubricating agents, conductive additives, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the organic light emitting materials and/or charge transporting materials or have a detrimental or undesired electrically doping effect on the organic light emitting materials and/or charge transporting materials.

To enhance the properties of the formulation optionally one or more of the following additives could be added, if desired:
a) one or more viscosity enhancers, preferably at a concentration where they do not negatively affect device performance,
b) one or more surfactants,
c) one or more additives, preferably polymers that modify the physical properties, electrical properties or stability of the printed formulation.

The viscosity enhancers a) usually include non-conducting, electronically inert polymers (matrix polymers; inert polymeric binders). Preferably one or more polymers are added as viscosity enhancer to raise the viscosity further.

Preferably, the composition may comprise 0 to 10% by weight, more preferably 0.5 to 5% by weight inert polymeric binders. The weight ratio of inert polymeric binders to organic light emitting materials and/or charge transporting materials preferably ranges from 20:1 to 1:20, more preferably from 10:1 to 1:10, more preferably from 1:2 to 1:5. However, the present invention enables the reduction of these binders, if necessary.

Preferred polymeric binders to adjust the rheological properties are described for example in WO 2005/055248 A1, in particular an organic binder which has a low permittivity (∈) at 1,000 Hz of 3.3 or less.

Suitable and preferred polymers are selected from the group consisting of organic solvent soluble polymers, like for example homo- or copolymers of low $M_w$ polyethylene, low $M_w$ polypropylene, other hydrocarbon backbone polymers, polybutadiene, polyethylene and propylene oxide, polystyrene, alpha methyl polystyrene, polyvinylcinnamate, poly(4-vinylbiphenyl) or poly(4-methylstyrene), associative thickeners, Septon® polymers like e.g. Septon® 4099 (available from Kuraray America Inc.), polytriarylamines, etc., or the polymers that are disclosed in US 2007/0102696 A1 for use as binders.

The viscosity enhancer a) may also be a semiconducting binder selected for example from polyarylamines, polyfluorenes, polythiophenes, polyspirobifluorenes, substituted polyvinylenephenylenes, polycarbazoles or polystilbenes, or copolymers thereof.

According to a preferred embodiment of the present invention, the inert binder is a polymer having a glass transition temperature in the range of −70 to 160° C., preferably 0 to 150° C., more preferably 50 to 140° C. and most preferably 70 to 130° C. The glass transition temperature can be determined by measuring the DSC of the polymer (DIN EN ISO 11357, heating rate 10° C. per minute).

The concentration of the surfactants b) is preferably from 0.001 to 4.0% by weight, more preferably 0.1 to 1.0% by weight relative to the total composition. Suitable surfactants are for example acetylenic diols or fluoro carbons. Preferably the surfactants have a boiling point (bp) similar to that of the solvent(s) which is (are) used. Examples of such acetylenic diols are those of the Surfynol® series, which are commercially available from Air Products, like for example Surfynol 502® (bp 202° C.), Surfynol 61® (bp 160° C.), Surfynol FS85® (bp 192° C.) or Surfynol PSA216® (bp 140° C.).

Surprising improvements can be achieved with volatile wetting agents. The term "volatile" as used above and below means that the agent can be removed from the organic light emitting materials and/or charge transporting materials by evaporation, after these materials have been deposited onto a substrate of an OLED device, under conditions (like temperature and/or reduced pressure) that do not significantly damage these materials or the OLED device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure.

Preferably, the wetting agents are not capable of chemically reacting with the organic light emitting materials and/or charge transporting materials. In particular they are selected from compounds that do not have a permanent doping effect on the organic light emitting materials and/or charge transporting materials (e.g. by oxidising or otherwise chemically reacting with the organic light emitting materials and/or charge transporting materials). Therefore, the formulation preferably should not contain additives, like e.g. oxidants or protonic or lewis acids, which react with the organic light emitting materials and/or charge transporting materials by forming ionic products.

Surprising effects can be accomplished by compositions comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° C. to 20° C.

Preferred wetting agents are non-aromatic compounds. With further preference the wetting agents are non-ionic compounds. Particular useful wetting agents comprise a surface tension of at most 35 mN/m, more preferably of at most 30 mN/m, and most preferably of at most 25 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, more preferably at least 5 mN/m and most preferably at least 10 mN/m.

Unexpected improvements can be achieved by wetting agents comprising a molecular weight of at least 100 g/mol, preferably at least 150 g/mol, more preferably at least 180 g/mol and most preferably at least 200 g/mol.

Suitable and preferred wetting agents that do not oxidise or otherwise chemically react with the organic light emitting materials and/or charge transporting materials are selected from the group consisting of siloxanes, alkanes, amines, alkenes, alkynes, alcohols and/or halogenated derivates of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms; $C_7$-$C_{14}$ alkanes, $C_7$-$C_{14}$ alkenes, $C_7$-$C_{14}$ alkynes, alcohols having 7 to 14 carbon atoms, fluoroethers having 7 to 14 carbon atoms, fluoroesters having 7 to 14 carbon atoms and fluoroketones having 7 to 14 carbon atoms. Most preferred wetting agents are methylsiloxanes having 8 to 14 carbon atoms.

Useful and preferred alkanes having 7 to 14 carbon atoms include heptane, octane, nonane, decane, undecane, dodecane, tridecane, tetradecane, 3-methylheptane, 4-ethylheptane, 5-propyldecane, trimethyl-cyclohexane and decalin.

Halogenated alkanes having 7 to 14 carbon atoms include 1-chloro-heptane, 1,2-dichlorooctane, tetrafluorooctane, decafluorododecane, perfluorononane, 1,1,1-trifluoromethyldecane, and perfluoromethyldecalin.

Useful and preferred alkenes having 7 to 14 carbon atoms include heptene, octene, nonene, 1-decene, 4-decene, undecene, dodecene, tridecene, tetradecene, 3-methylheptene, 4-ethylheptene, 5-propyldecene, and trimethylcyclohexene.

Halogenated alkenes having 7 to 14 carbon atoms include 1,2-dichloro-octene, tetrafluorooctene, decafluorododecene, perfluorononene, and 1,1,1-trifluoromethyldecene.

Useful and preferred alkynes having 7 to 14 carbon atoms include octyne, nonyne, 1-decyne, 4-decyne, dodecyne, tetradecyne, 3-methylheptyne, 4-ethylheptyne, 5-propyldecyne, and trimethylcyclohexyne.

Halogenated alkenes having 7 to 14 carbon atoms include 1,2-dichloro-octyne, tetrafluorooctyne, decafluorododecyne, perfluorononyne, and 1,1,1-trifluoromethyldecyne.

Useful and preferred alcohols having 7 to 14 carbon atoms include, heptanol, octanol, nonanol, decanol, undecanol, dodecanol, tridecanol, tetradecanol, 3-methylheptanol, 3,5-dimethyl-1-hexyn-3-ol, 4-ethyl-heptanol, 5-propyldecanol, trimethylcyclohexanol and hydroxyldecalin.

Halogenated alcohols having 7 to 14 carbon atoms include 1-chloro-heptanol, 1,2-dichlorooctanol, tetrafluorooctanol, decafluorododecanol, perfluorononanol, 1,1,1-trifluoromethyldecanol, and 2-trifluoromethyl-1-hydroxydecalin.

Useful and preferred fluoroethers having 7 to 14 carbon atoms include 3-ethoxy-1,1,1,2,3,4,4,5,5,6,6,6 dodecafluoro-2-trifluoromethylhexane, 3-propoxy-1,1,1,2,3,4,4,5,5,6,6,6 dodecafluoro-2-trifluoromethylhexane, and 3-propoxy-1,1,1,2,3,4,4,5,5,5 decafluoro-2-trifluoromethylpentane.

Useful and preferred fluoroesters having 7 to 14 carbon atoms include 3-(1,1,1,2,3,4,4,5,5,6,6,6 dodecafluoro-2-trifluoromethyl-hexyl)ethanoate, and 3-(1,1,1,2,3,4,4,5,5,5 decafluoro-2-trifluoromethyl-pentyl) propanoate.

Useful and preferred fluoroketones having 7 to 14 carbon atoms include 3-(1,1,1,2,3,4,4,5,5,6,6,6 dodecafluoro-2-trifluoromethyl-hexyl)ethyl-ketone, and 3-(1,1,1,2,3,4,4,5,5,5 decafluoro-2-trifluoromethyl-pentyl) propylketone.

Useful and preferred siloxanes include hexamethyldisiloxane, octamethyl-trisiloxane, decamethyltetrasiloxane, dodecamethylpentasiloxane, and tetradecamethylhexasiloxane.

Preferably, the solvent should be selected such that it can be evaporated from the coated or printed layer comprising the organic light emitting materials and/or charge transporting materials together with any other volatile additive, preferably in the same processing step. The processing temperature used for removing the solvent and any volatile additive should be selected such that the layer, comprising the organic light emitting materials and/or charge transporting materials, is not damaged. Preferably the deposition processing temperature is from room temperature (RT; about 25° C.) to 135° C. and more preferably from RT to 80° C.

The concentration of the additives, preferably polymers c) modifying the physical properties is preferably 0.001 to 200 wt. % relative to the amount of the organic light emitting materials and/or charge transporting materials.

Preferably, the composition of the present invention comprises a surface tension in the range of 15 to 80 mN/m, more preferably 20 to 60 mN/m, most preferably 25 to 45 mN/m at 25° C. The surface tension can be measured using a FTA (First Ten Angstrom) 125 contact angle goniometer as mentioned above and below. The surface tension can be achieved by selection the polymeric binder and the solvent in an appropriate manner. The use of the Hanson Solubility Parameters as mentioned above provides a useful aid for a person skilled in the art. Furthermore, the surface tension can be achieved by using a wetting agent, preferably a volatile wetting agent as mentioned above.

Preferably, the composition has a viscosity in the range from 10 to 700 mPas, more preferably from 15 to 630 mPas and most preferably from 30 to 500 mPas. The viscosity is determined at a temperature of 25° C. by measuring on AR-G2 rheometer manufactured by TA Instruments. This is measured using a parallel plate geometry.

Preferably, the composition can be filtered e.g. to 1 micron or less.

During the process of preparing an OLED device, the layer, comprising the organic light emitting materials and/or charge transporting materials, is deposited onto a substrate, followed by removal of the solvent(s) together with any volatile additive(s) present, to form a film or layer.

The substrate can be any substrate suitable for the preparation of OLED devices, or can also be the OLED device, or a part thereof. Suitable and preferred substrates are e.g. glass, ITO coated glass, ITO glass with pre-coated layers including PEDOT, PANI etc, flexible films of polyethylene terephthalate (PET), polyethylene naphthalate (PEN), polyimide, and flexible films with ITO, or other conducting layers and barrier layers e.g. Vitex film.

Deposition of the layer, comprising the organic light emitting materials and/or charge transporting materials, can be achieved by standard methods that are known to the person skilled in the art and are described in the literature. Suitable and preferred deposition methods include liquid coating and printing techniques. Very preferred deposition methods include, without limitation, dip coating, spin coating, ink jet printing, nozzle printing, letter-press printing, screen printing, gravure printing, doctor blade coating, roller printing, reverse-roller printing, offset lithography printing, flexographic printing, web printing, spray coating, dip coating, curtain coating, brush coating, slot dye coating or pad printing. Gravure, flexographic and inkjet printing are especially preferred.

Removal of the solvent(s) and any volatile additive(s) is preferably achieved by evaporation, for example by exposing the deposited layer to high temperature and/or reduced pressure, preferably at 50 to 200° C., more preferably 60 to 135° C.

The thickness of the layer, comprising the organic light emitting materials and/or charge transporting materials, is preferably from 1 nm to 500 nm, more preferably from 2 to 150 nm.

Further to the materials and methods as described above and below, the OLED device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers. Dendrimers are typically branched macromolecular compounds consisting of a multifunctional core group onto which further branched monomers are added in a regular way giving a tree-like structure, as described e.g. in M. Fischer and F. Vogtle, *Angew. Chem., Int. Ed.* 1999, 38, 885.

The term "conjugated polymer" means a polymer containing in its backbone (or main chain) mainly C atoms with sp²-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like arylamines, arylphosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with sp²-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, like any additives, given in percentages or ppm are related to the entire formulation including the solvents.

The invention will now be described in more detail by reference to the following examples, which are illustrative only and do not limit the scope of the present invention.

WORKING EXAMPLES

Example 1

Example of OE Flexo Printing of a Bottom Gate FET Device Using an Inventive Ink Composition The polyethylenenaphthalate substrate (Q 65 FA) was cut into small pieces, which were a little bit bigger than the masks. Then these were cleaned by sonicating them in methanol for 2 minutes. Then they were rinsed with methanol and dried with compressed air.

The gate mask was placed to the cleaned substrate and the evaporator was used to coat aluminium with a thickness of 30 nm.

Then adhesion promoter Lisicon™ M009 was spin coated for 10 s with 1500 rpm, left for 20 s on the hot plate at 120° C. and then washed with propan-2-ol for 10 s with 1500 rpm.

Afterwards the dielectric material Lisicon™ D 180 was spin coated for 30 s at 1500 rpm, then the substrate was left for 1 min on a hot plate at 120° C. and then left for 30 s under the 254 nm UV lamp. Following this, it was left for 3 min on a hot plate at 120° C.

The substrate was covered for 1 min with reactive washing solution Lisicon™ M001 and washed with propan-2-ol.

An OSC ink was made up by dissolving 2% of a compound of formula M2 in 40% o-xylene and 60% decahydro-2-naphthol.

In formula M2 one of $Y^1$ and $Y^2$ denotes —CH= or =CH— and the other denotes —S— and one of $Y^3$ and $Y^4$ denotes —CH= or =CH— and the other denotes —S—.

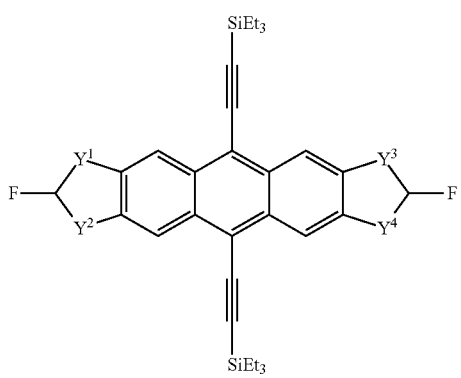

M2

This OSC ink was printed with the FLEXI PROOF 100 flexographic printer using an impression roller made up of a plurality of square blocks of print area measuring 5 cm×5 cm, 1 cm×1 cm, 5 mm×5 mm and 2 mm×2 mm. The conditions used were: anilox roller: 55 L/cm screen, volume: 18.09 cm$^3$/m$^2$, printed speed: 30 m/min, anilox pressure: 50, impression roller pressure: 90.

A source and drain mask was then placed on the printed OSC and Au electrodes evaporated. Analysis of device performance was then undertaken and the following results were obtained.

Analysis of the device performance is then undertaken using an Agilent 4155C semiconductor parameter analyzer, measuring the source and drain current and gate current as a function of the gate voltage (transistor characteristics). The charge carrier mobility is calculated by known methods, as disclosed for in US 2007/0102696 A1.

Figure 2:
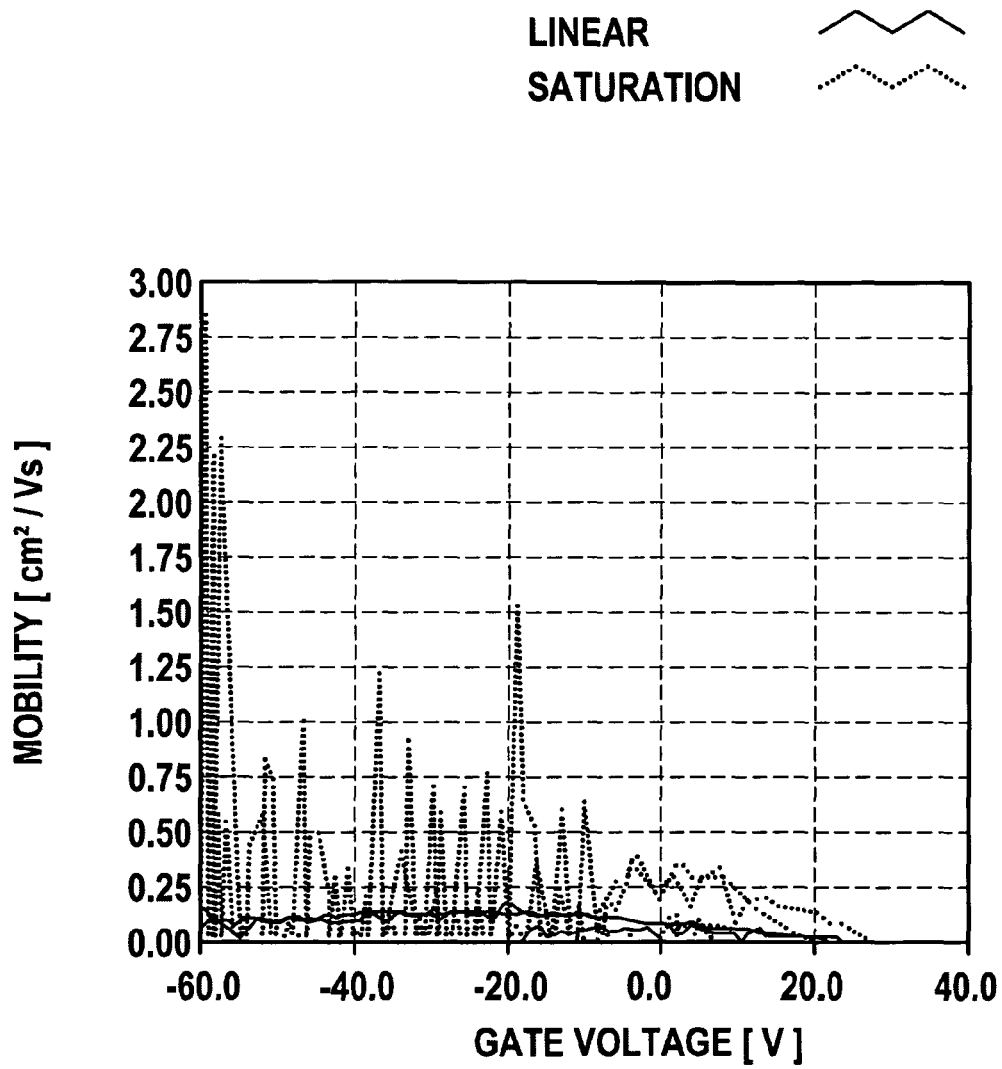

The transistor characteristic and the linear and saturation mobility of the device are depicted in FIGS. 1 and 2. The device has a high mobility (linear 0.1 cm$^2$/Vs, saturation 0.3 cm$^2$/Vs) and good on/off ratio ($10^5$).

The data show that the ink according to the present invention can be printed using flexographic printing techniques, and can also generate working transistor devices that demonstrate both high mobility and a good on/off ratio.

Example 2

Example of OLED Flexo Printing Using an Inventive Ink Composition

The polyethylenenaphthalate substrate (Q 65FA) was cut into two inch squares.
ITO Etching
The substrate was spin coated with photoresist (Allresist Positiv-Photoresist AR-P 3540) for 40 s with 3500 rpm and heated on a hot plate for 120 s at 100° C. A 5 mm mask was attached to the centre of the sample before UV exposure at 165 mJ/cm$^2$ 365 nm for 15 s/0.011 W/cm$^2$. The mask was removed and the substrate treated with Allresist Developer: DI water (1:1) for 3×15 s with intermediate washings with DI water in the spin coater. The substrate was then heated on a hot plate for 1 min at 120° C. before immersion in 37% HCl:DI water (3:1) for 30 s, followed by rinsing with DI water (repeated twice). The substrate was then immersed in 37% HCl for 15 s and rinsed with DI water (repeated once). The substrate was immersed in acetone for 6 s, rinsed on a spin coater with IPA and dried on a hot plate at 100° C.

PEDOT Deposition
The substrate was treated with O$_3$ for 15 min, spin coated with PEDOT for 30 s at 4500 rpm and heated on a hot plate for 60 min at 180° C.
HIL-012 Deposition
The substrate was spin coated with HIL-012 (5 g/l in toluene) for 30 s at 2500 rpm and heated on a hot plate for 60 min at 180° C. HIL-012 is an interlayer material commercially available from Merck KGaA.

An OLED ink was formulated by dissolving 1% of a mixture of M3 and E1 (93/7) in decahydro-2-naphthol:3,4-dimethylanisole (90:10).

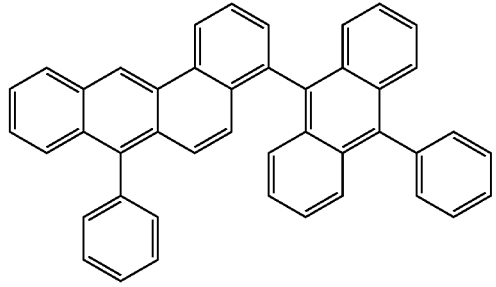

M3

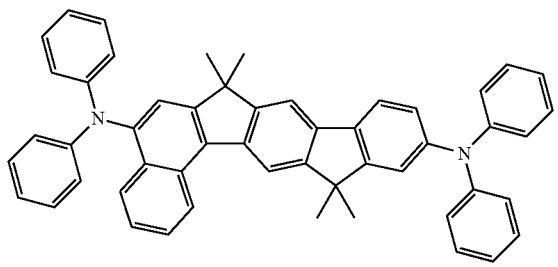

E1

This ink was printed with the FLEXI PROOF 100 flexographic printer onto the ITO strip using an impression roller square block of print area measuring 1.8 cm$^2$. The conditions used were: anilox roller: 40 L/cm screen, volume: 30.6 cm$^3$/m$^2$, printed speed: 80 m/min, anilox pressure: 50, impression roller pressure: 90. The sample was dried under vacuum at room temperature or on a hot plate at 100° C.

Example 3

Example of OLED IJ Printing Using an Inventive Ink Composition

The substrate (2 cm$^2$ glass plates coated with PEDOT) was a) heated for 10 min at 180° C. and used directly, or b) heated for 5 min to 180° C., spin coated with HIL-012 (5 g/l in toluene) for 30 s at 2500 rpm and heated on a hot plate for 60 min at 180° C.

An OLED ink was formulated by dissolving 1% of a mixture of M3 and E1 (93/7) in decahydro-2-naphthol:3,4-dimethylanisole (60:40) and gave a viscosity of 10 cp at 35° C.

This ink was printed with the Dimatix DMP 2800 printer onto the substrate (PEDOT or PEDOT and HIL-012 coated). 6 mm squares were printed with a drop spacing of 15 and 20 μm, and dried on a hot plate at 100° C. or under vacuum at room temperature or 50° C.

Figure 3:
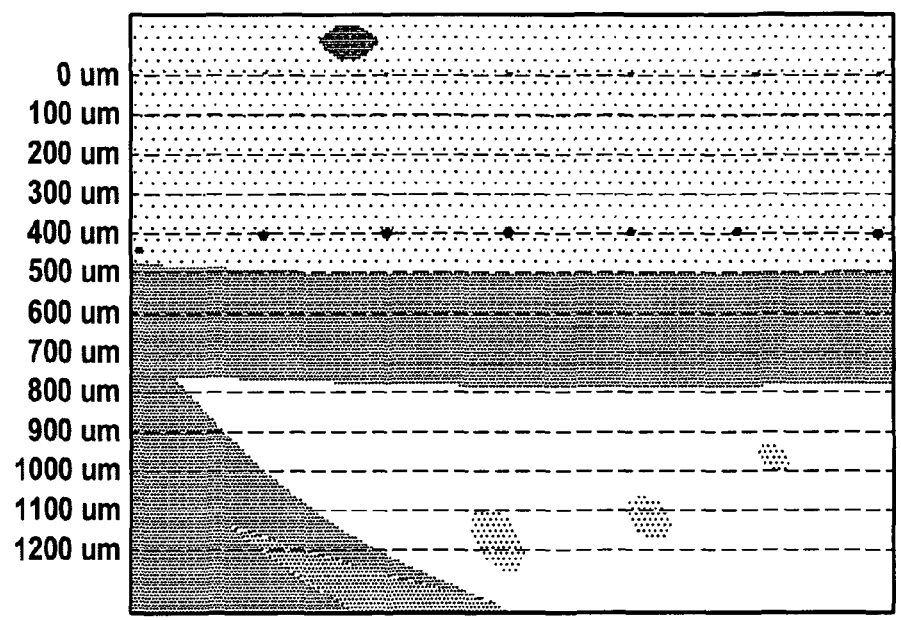
FIG. 3 illustrates the drop formation in the ink jet process was good.
Figure 4:
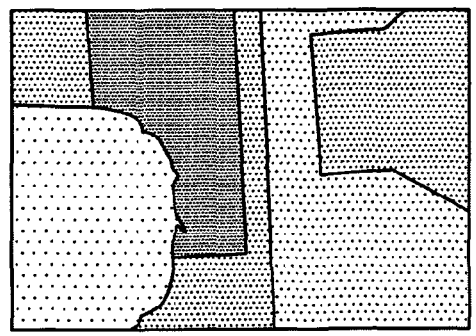
FIG. 4 illustrates a film of OLED (vacuum dried at room temperature was formed which was observed using fluorescence.

Drop formation in the ink jet process was good (FIG. 3) and a film of OLED (vacuum dried at room temperature was formed which was observed using fluorescence (The PL images of the films were taken using a Nikon Eclipse E400 microscope, FIG. 4).

The invention claimed is:

1. A coating or printing ink composition for the preparation of an OLED, wherein the composition comprises one or more phosphorescent compounds and/or charge transporting materials having a molecular weight of at most 5000 g/mol, and a solvent blend of two or more organic solvents that includes one solvent with a viscosity at 25° C. in the range of 30 to 500 mPas and the boiling point of the solvent is at most 400° C., and another solvent with a viscosity at 25° C. of less than 10 mPas, wherein the concentration of the phosphorescent compounds, and/or charge transporting materials in the coating or printing ink composition is between 0.01 and 20% by weight, based on total weight of the solvent blend, and the phosphorescent compounds are selected from one or more compounds of formulae (1) to (4):

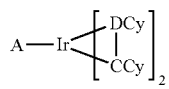

formula (1)

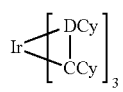

formula (2)

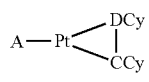

formula (3)

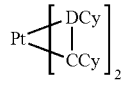

formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C—, and in which one or more hydrogen atoms may be replaced by F, or an aryl or heteroaryl group which has from 4 to 14 carbon atoms and may be substituted by one or more nonaromatic $R^1$ radicals.

2. The composition according to claim 1, wherein said composition comprises a surface tension in the range of 15 mN/m to 80 mN/m.

3. The composition according to claim 1, wherein said organic solvent blend includes an alcohol.

4. The composition according to claim 3, wherein the alcohol is a cyclic alcohol is selected from the group consisting of alkyl cyclohexanols, naphthols, terpenoids, a-terpineol, menthol or carveol, nonylphenol, 1-indanol, and 2-indanol.

5. The composition according to claim 1, wherein said composition comprises at least 80% by weight of said organic solvents.

6. The composition according to claim 1, wherein said composition comprises at least one inert binder.

7. The composition according to claim 1, wherein the one or more phosphorescent compounds and/or charge transporting materials emits light and includes at least one atom having an atomic number greater than 38.

8. The composition according to claim 1, wherein the composition comprises a host material.

9. The composition according to claim 1, wherein the composition comprises at least one wetting agent.

10. A process of preparing an organic light emitting diode (OLED) device, comprising the steps of
a) applying a coating or printing ink composition onto a substrate to form a film or layer, the composition comprising one or more phosphorescent compounds and/or charge transporting materials having a molecular weight of at most 5000 g/mol, and a solvent blend of two or more organic solvents that includes one solvent with a viscosity at 25° C. in the range of 30 to 500 mPas and the boiling point of the solvent is at most 400° C., and another solvent with a viscosity at 25° C. of less than 10 mPas, wherein the concentration of the phosphorescent compounds, and/or charge transporting materials in the coating or printing ink composition is between 0.01 and 20% by weight, based on total weight of the solvent blend, and the phosphorescent compounds are selected from one or more compounds of formulae (1) to (4):

formula (1)

formula (2)

formula (3)

formula (4)

where
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or —C≡C— and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or and in which one or more hydrogen atoms may be replaced by F, or an aryl or heteroaryl group which has from 4 to 14 carbon atoms and may be substituted by one or more nonaromatic $R^1$ radicals, and b) removing the two or more solvents of the solvent blend.

11. The process according to claim 10, wherein the composition is applied by dip coating, spin coating, ink jet printing, nozzle printing, letter-press printing, screen printing, gravure printing, doctor blade coating, roller printing, reverse-roller printing, offset lithography printing, flexographic printing, web printing, spray coating, dip coating, curtain coating, brush coating, slot dye coating or pad printing.

12. An OLED device prepared from the composition according to claim 1.

13. An OLED device prepared from the process according to claim 10.

14. The composition according to claim 1, wherein the organic solvent with a viscosity in the range of 30 to 500 mPas is selected from decahydro-2-naphthol or 1,2,3,4-tetrahydro-1-naphthol, and the solvent with a viscosity of less than 10 mPas is selected from tetralin, decalin, or methylated benzenes.

15. The composition according to claim 14, wherein the solvent blend is a binary solvent blend selected from the group consisting of o-xylene/decahydro-2-naphthol with a weight percent ratio of from 5/95 to 40/60, tetralin/1,2,3,4-tetrahydro-1-naphthol with a weight percent ratio of from 25/75 to 50/50, and decalin/decahydro-2-naphthol with a weight percent ratio of from 25/75 to 50/50.

16. A coating or printing ink for the preparation of OLED devices, the coating or printing ink including a composition comprising:
one or more phosphorescent compounds selected from compounds of formulae (1) to (4)

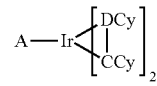

formula (1)

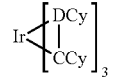

formula (2)

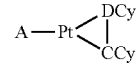

formula (3)

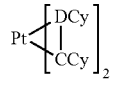

formula (4)

wherein
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C=O—, —CH=CH— or —C≡C— and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C=O—, —CH=CH— or —C≡C— and in which one or more hydrogen atoms may be replaced by F, or an aryl or heteroaryl group which has from 4 to 14 carbon atoms and may be substituted by one or more nonaromatic $R^1$ radicals; and a solvent blend of two or more organic solvents that includes one solvent with a viscosity at 25° C. in the range of 30 to 500 mPas and the boiling point of the solvent is at most 400° C., and another solvent with a viscosity at 25° C. of less than 10 mPas, wherein the concentration of the phosphorescent compounds, and/or charge transporting materials in the coating or printing ink composition is between 0.2 and 10% by weight, based on total weight of the solvent blend.

17. The composition according to claim 16, wherein the solvent blend is a binary solvent blend selected from the group consisting of o-xylene/decahydro-2-naphthol with a weight percent ratio of from 5/95 to 40/60, tetralin/1,2,3,4-tetrahydro-1-naphthol with a weight percent ratio of from 25/75 to 50/50, and decalin/decahydro-2-naphthol with a weight percent ratio of from 25/75 to 50/50.

18. A coating or printing ink composition for the preparation of an OLED, wherein the composition comprises organic light emitting materials and/or charge transporting materials having a molecular weight of at most 5000 g/mol, and a solvent blend of two or more organic solvents, the solvent blend including one solvent selected from decahydro-2-naphthol or 1,2,3,4-tetrahydro-1-naphthol, and another solvent selected from tetralin, decalin, or methylated benzenes, wherein the concentration of the organic light emitting materials, and/or charge transporting materials, in the coating or printing ink composition is between 0.01 and 20% by weight, based on total weight of the solvent blend.

19. The composition according to claim 18, wherein the boiling point of the lowest boiling solvent of the solvent blend is at least 130° C. at atmospheric pressure.

20. The composition according to claim 16, wherein the boiling point of the lowest boiling solvent of the solvent blend is at least 130° C. at atmospheric pressure.

21. The composition according to claim 1, wherein the boiling point of the lowest boiling solvent of the solvent blend is at least 130° C. at atmospheric pressure.

* * * * *